United States Patent [19]

Ohkuma et al.

[11] Patent Number: 5,574,570
[45] Date of Patent: Nov. 12, 1996

[54] VIDEO SIGNAL RECORDING/REPRODUCTION APPARATUS AND METHOD FOR RECORDING/REPRODUCING TWO KINDS OF VIDEO SIGNALS CARRYING DIFFERENT AMOUNTS OF INFORMATION

[75] Inventors: Ikuo Ohkuma; Makoto Kumano; Kihei Ido; Ken Onishi, all of Nagaokakyo, Japan

[73] Assignee: Mitsubishi Denki Kabushiki Kaisha, Tokyo, Japan

[21] Appl. No.: 57,774

[22] Filed: May 6, 1993

[30] Foreign Application Priority Data

| May 12, 1992 | [JP] | Japan | 4-118740 |
| May 22, 1992 | [JP] | Japan | 4-130583 |
| May 28, 1992 | [JP] | Japan | 4-136853 |

[51] Int. Cl.$^6$ .............................. H04N 5/76; H04N 5/91; G11B 5/02
[52] U.S. Cl. ............................................. 386/103; 386/104
[58] Field of Search .................................. 358/343, 341, 358/342, 335, 310; 360/18, 19.1, 32

[56] References Cited

U.S. PATENT DOCUMENTS

| 4,473,850 | 9/1984 | Foerster et al. . |
| 4,862,292 | 8/1989 | Enari et al. . |
| 4,963,991 | 10/1990 | Honjo ........................................ 358/310 |
| 4,972,417 | 11/1990 | Sako et al. . |
| 5,191,431 | 3/1993 | Hasegawa et al. . |

FOREIGN PATENT DOCUMENTS

| 0404383 | 12/1990 | European Pat. Off. . |
| 0469861 | 2/1992 | European Pat. Off. . |
| 63-098876 | 4/1988 | Japan . |
| 63-155877 | 6/1988 | Japan . |
| 346881 | 2/1991 | Japan . |
| 2217509 | 3/1989 | United Kingdom . |
| 2220521 | 1/1990 | United Kingdom . |
| 2258751 | 2/1993 | United Kingdom . |

OTHER PUBLICATIONS

"Specifications of High Definition VTR for Consumer Use"; vol. 15 No. 50, VIR91–33. 9, 1991.
"Home Video Technology"; NHK Publishing Co., Ltd.
Digital Television Tape Recording: A Report of Progress toward a Standard, SMPTE Journal, Sep. 1985.
"An Experimental Digital VCR with 40 mm Drum, Single Actuator and DCT–Based Bit–Rate Reduction" by S. M. C. Borgers, Philips Consumer Electronics, 1988 IEEE, pp. 597–605.

*Primary Examiner*—Thai Q. Tran
*Assistant Examiner*—Robert Chevalier

[57] ABSTRACT

When recording HD video signals, twice the number of tracks are used as compared to recording the conventional NTSC video signals, and video signals are recorded in the audio sector. HD video signals are encoded with the same number of checks as the error-correcting code of the present video signals, with the number of information symbols being increased. When recording HD video signals and present video signals, these signals are encoded so that the shortest recording wavelength is the same with either signal.

27 Claims, 24 Drawing Sheets

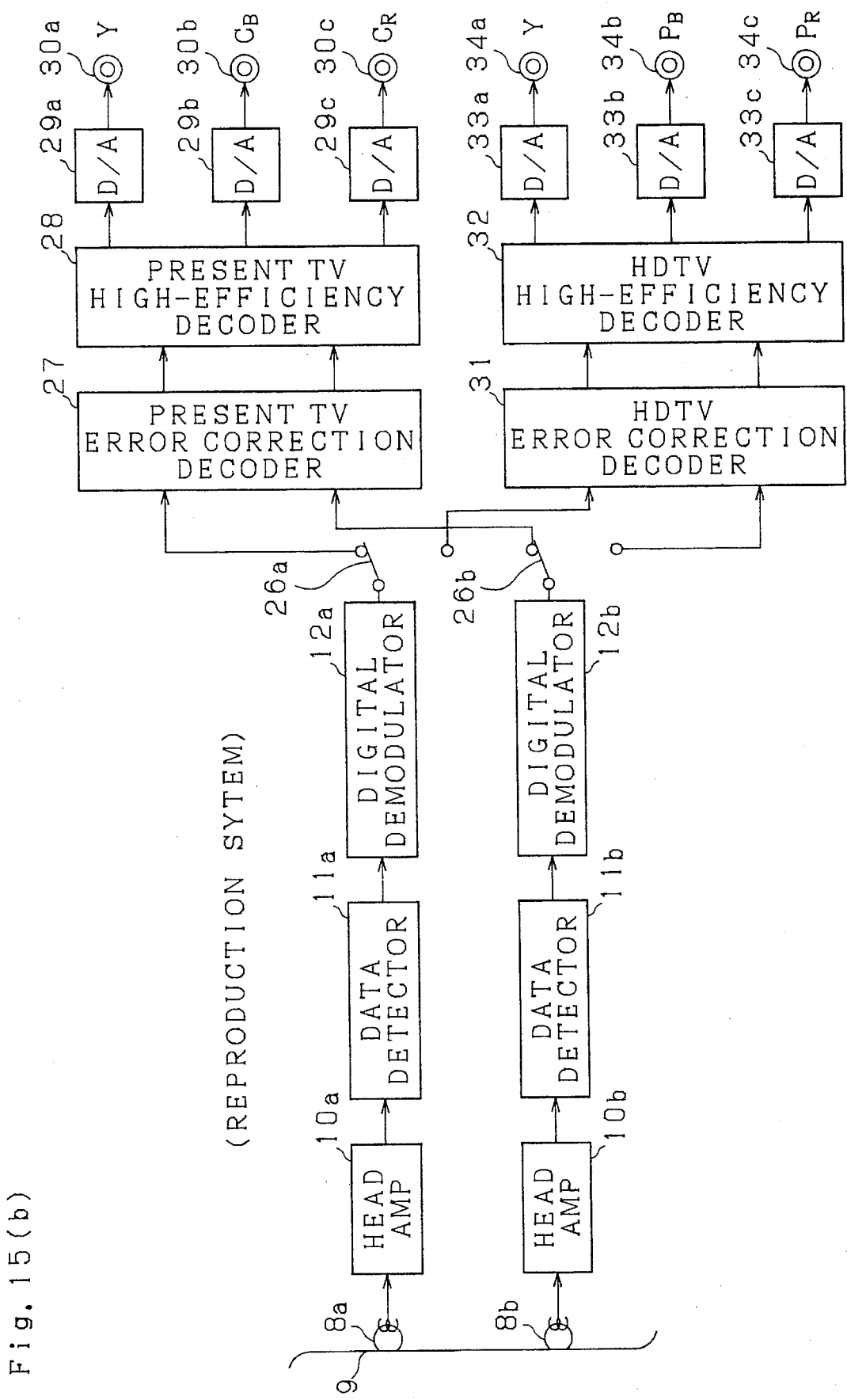
Fig. 15(b) (REPRODUCTION SYTEM)

ERROR-CORRECTING CODE FOR PRESENT TV

ERROR-CORRECTING CODE FOR HDTV

VIDEO SIGNAL RECORDING/REPRODUCTION APPARATUS AND METHOD FOR RECORDING/REPRODUCING TWO KINDS OF VIDEO SIGNALS CARRYING DIFFERENT AMOUNTS OF INFORMATION

BACKGROUND OF THE INVENTION

1. Field of the Invention

The present invention relates to a video signal recording/reproduction apparatus (called VTR hereafter) used in recording and reproducing two kinds of video signals which carry different amounts of information, for example present video signals and HD (High Definition) video signals.

2. Description of Related Art

Conventionally, various systems of rotary head type digital signal recording and reproducing apparatus have been developed. As a typical example of such apparatuses, a digital VTR for broadcasting service known as D-2 system will be given an explanation hereinafter.

FIG. 1 is a schematic block diagram showing one example of D-2 system digital VTR. In the figure, numeral 101 is an input terminal for video signal, through which an analog video signal enters to an A/D converter 103, which converts the signal to a digital signal and outputs it to a digital recording signal processor 105. On the other hand, numeral 102 is an input terminal for an audio signal, through which an analog audio signal enters an A/D converter 104, which converts the signal to a digital signal and outputs it to the digital recording signal processor 105. The digital recording signal processor 105 carries out error-correction encoding, digital modulation, etc. and outputs the processed signal to recording AMPs 106, 107. The recording AMPs 106, 107 amplify input signals. The amplified signal is distributed to four recording and reproducing heads 112, 113, 114, and 115 via recording/reproducing selecting switches 108, 109 and via head selection switches 110, 111 and is recorded on a magnetic tape (not shown). Numerals 116–122 show components of reproducing parts. Reproducing AMPs 116 and 117 amplify signals which are reproduced on recording and reproducing heads 112, 113, 114, 115 and are transferred through switches 110, 111 and through switches 108, 109, and the amplified signal is then output to a digital reproducing signal processor 118. The digital reproducing signal processor 118 carries out digital demodulation and error-correction decoding etc., and outputs video and audio signals of normal signal strings to D/A converters 119 and 120. The D/A converter 119 converts the input signal to the original analog video signal and outputs it via an output terminal 121. The D/A converter 120 converts the input signal to the original analog signal and outputs it via an output terminal 122.

FIG. 2 shows a tape format of D-2 system digital VTR. As shown in FIG. 2, in the D-2 system, a cue, time record, and control tracks are provided in the longitudinal direction of the magnetic tape. On the track tilted in the longitudinal direction of the magnetic tape, video and audio signals are digitally recorded. The audio signal is arranged in a total of four channels; the video signals is sandwiched by four channels with two channels on either side.

Referring now to FIG. 1, operations will be described in detail hereinafter. A composite video signal supplied to the input terminal 101 is sampled at quadruple subcarrier frequency (14.318 MHz) and is converted into the digital signal of 8 quantized bits (at the A/D converter 103). The audio signal supplied to the input terminal 102 is sampled at 48 kHz and is converted into the digital signal of 20 quantized bits (at the A/D converter 104). In the figure, for simplification, the audio signal input is represented by one channel but, in practice, four channel audio signal is supplied. The digitized video and four-channel audio signals are supplied to the digital recording signal processor 105. At the digital recording signal processor 105, the video and four-channel audio signals are time-base-processed and at the same time error-correcting codes are assigned to these signals in accordance with the format. The error-correcting codes are separately assigned to the respective video and four-channel audio signals. The error-correcting codes assigned to video signals as C2 codes (also called outer codes) are (136, 128, 9) Reed-Solomon codes, and the error-correcting codes assigned to audio signals as C2 codes are (16, 8, 9) RS codes. As C1 codes (also called inner codes) (93, 85, 9) RS codes are used in common for video signals and audio signals. The digital recording signal processor 105 further performs digital modulation processing in accordance with a specified modulation system. The output signal of digital recording signal processor 105 is distributed to the recording and reproducing heads 112, 113, 114, and 115, respectively, by the head selection switches 110 and 111 via recording AMPs 106, 107 as well as recording/reproducing selecting switches 108, 109. It is then recorded on a magnetic tape in accordance with the tape format shown in FIG. 2. In this system, the data rate after the error-correcting code assigning is 127 Mbit/sec, and in terms of video signal, the data for 1 field is divided to be recorded in 6 tracks.

The recorded signal is reproduced as follows. The signal reproduced by the recording and reproducing heads 112, 113, 114, 115 enters to the digital reproducing signal processor 118 after being passed through head selection switches 110 and 111 as well as recording/reproducing selecting switches 108 and 109 and amplified by the reproducing AMPs 116, 117. The digital reproducing signal processor 118 performs digital demodulation and error-correction decoding and the signal is decoded into the normal video signal data string and the 4-channel audio signal data string to be outputted. The output signal of digital reproducing signal processor 118 is returned to the original video and 4-channel audio signals by the D/A converters 119, 120 and outputted via the output terminals 121, 122.

Video signals received in D-2 system, as described above, are video signals having 525/625 horizontal lines and field frequency of 60/50 Hz which are employed in the present television system. When such a VTR that is capable of recording high definition video signals with 1125 horizontal lines and field frequency of 60 Hz in addition to the present video signals, the amount of signals such a VTR must handle is 1.188 G bits/sec. This figure is based upon 74.25 MHz for the sampling frequency of luminance signal, 37.125 MHz for the color difference signal and 8 bits for the number of quantization bits. While recording the signals of both specifications requires the control of drum revolution speed and the number of heads, both the drum revolution speed and the number of heads can be controlled more easily when they are set in the ratio of integers. Video signal rates are not in the ratio of integers.

A technique of compressing the amount of information by applying high-efficiency encoding process to the conventional video signals is introduced in IEEE Transactions on Consumer Electronics, Vol. 34, No. 3 (AUGUST, 1988), pp 597–605, "AN EXPERIMENTAL DIGITAL VCR WITH 40 MM DRUM, SINGLE ACTUATOR AND DCT-BASED BIT-RATE REDUCTION".

FIG. 3(a) shows a block circuit diagram of the record system of the digital VTR. In FIG. 3(a), numerals 1a through 1c denote input terminals. Numerals 2a through 2c denote A/D converters to convert analog data to digital data. Numeral 3 denotes a high-efficiency encoder which applies high-efficiency encoding to input luminance signal Y and color difference signals CB and CR. Numeral 4 denotes an error correction encoder which appends error-correcting codes to 2-channel output data of the high-efficiency encoder circuit 3 for the detection or correction of errors generated during reproduction of data. Numerals 5a, 5b denote digital modulators which applies digital modulation to the output data of the error correction encoder circuit 4. Numerals 6a, 6b denote synchronization/ID appending circuits which appends synchronization signal and ID signal to the data. Numerals 7a, 7b denote recording amplifiers. Numerals 8a, 8b denote rotary heads. Numeral 9 denotes a magnetic tape.

FIG. 3(b) shows a block circuit diagram of the reproduction system of a conventional digital VTR. In FIG. 3(b), numerals 8a, 8b, 9 denote identical components as those in FIG. 3(a) and the description thereof will be omitted. Numerals 10a, 10b denote head amplifiers which amplify the signals reproduced by the rotary head amplifiers which amplify the signals reproduced by the rotary heads 8a, 8b. Numerals 11a, 11b denote data detectors which detect data from the reproduced signals and at the same time detects jitter of the reproduced signals. Numerals 12a, 12b denote digital demodulators. Numeral 13 denotes an error correction decoder which detects and corrects errors in the reproduced signals. Numeral 14 denotes a high-efficiency decoder which applies high-efficiency decoding to the output of the error correction decoder 13 and restores the video signals. Numerals 15a through 15c denote D/A converters which convert the digital signals to analog signals. Numerals 16a, through 16c denote output terminals.

Operation of the record system will now be described below with reference to FIG. 3(a). Luminance signal Y and two color difference signals CB and CR received at the input terminals 1a through 1c are A/D converted by the A/D converters 2a through 2c and are processed in the high-efficiency encoder 3 to reduce the transmission bit rate. Operation of the high-efficiency encoder is the same as that described in the literature mentioned above, and the detailed description thereof will be omitted. The data to be recorded with the transmission bit rate being reduced in the high-efficiency encoder 3 is processed in the error correction encoder 4 to be provided with error-correcting codes appended thereto for the detection and correction of errors generated during reproduction. The codes appended in this process are double RS codes of C1 (72, 56, 17) and C2 (61, 54, 8). FIG. 4 shows the data encoded with C1 and C2 (the data is called the encoded block hereafter). The data to be recorded with check signals (called check hereafter) appended thereto in the error correction encoder 4 is processed in the digital modulators 5a, 5b to suppress the low frequency components of the signal according to the specified modulation rule. Digital-modulated signals to be recorded are processed in the SYNC-ID appending circuits 6a, 6b to be provided with synchronization signal and ID signal appended thereto, then amplified by the recording amplifiers 7a, 7b and recorded onto the magnetic tape 9 via the rotary heads 8a, 8b. Eight code blocks are recorded in a single track.

Operation of the reproduction system will be described similarly with reference to FIG. 3(b). 2-channel reproduced signals which have been reproduced from the magnetic tape 9 via the rotary heads 8a, 8b are amplified by the head amplifiers 10a, 10b, then converted to digital data by the data detectors 11a, 11b while at the same time jitter (time domain error) included in the reproduced signals is absorbed. Reproduced digital data fed to the digital demodulator 12a, 12b is digital-demodulated and fed to the error correction decoder 13. The error correction decoder 13 detects and corrects errors generated in the reproduced signals based on the check which has been appended in advance during recording. Reproduced signals with errors having been detected or corrected by the error correction decoder 13 are subject to processes such as variable length decoding and inverse DCT conversion in the high-efficiency encoder 14, then with the original luminance signal Y and the two color difference signals CB and CR being restored, converted to analog data by the D/A converter circuits 15a through 15c, and provided as output through the output terminals 16a through 16c.

Conventional VTR is constituted as described above. Recording of video signals of another type by means of a digital VTR having such a recording format, for example recording of HDTV signals by applying high-efficiency encoding process to increase the amount of information twofold over that of the present TV signals with a digital VTR which compresses the information by applying high-efficiency encoding process to the present TV signals (NTSC), requires twice the number of tracks and reduces the recording time to a half, provided that recording is done with the same density. Also there has been a problem that an attempt to obtain the same recording time leads to twice the recording density which makes it difficult to make a tape and an electromagnetic conversion system which accommodates such a high recording density. Further, there has been a problem that, in order to record additional information such as the high definition TV data and the index information representing the contents of the video information in addition to the video signals, the increase in the amount of information which must be recorded results in shorter recording time if the recording density is the same.

An example of the conventional video signal recording and reproduction apparatus is the VTR of VHS system which is the most popular VTR for the use in homes and is described in "Home Video technology" published by NHK Publishing Co., Ltd. Part of the specifications of the VHS type VTR are shown in table 1.

TABLE 1

| Recording system | Video signal | Luminance signal: FM recording, Color signal: Low frequency range-converted color signal Recording SP system |
|---|---|---|
| | Audio signal | AC current bias recording |
| Drum diameter | 62 mm | |
| Drum evolution speed | 29.97 rps | |
| Relative speed | 5.8 m/sec | |

In the VHS system, luminance signals of NTSC video signals are converted to FM signals of low-frequency carrier wave, and even white level is defined as 4.4±0.1 MHz. Color signals are converted to low frequencies not higher than 1 MHz, and are superimposed with the FM waves of the luminance signals and recorded. These signals are recorded onto a magnetic tape at a rate of 1 track/field and reproduced from it by means of two heads opposing to each other separated by 180° on a drum measuring 62 mm in diameter which rotates at a revolution speed of 1800 rpm.

As for the VTR system for consumer use of the high definition standard which is viewed as the next generation video system, a report is published in the Transaction of The Japan Television Engineering Association, Vol. 15, No. 50, VIR91-33, "Specifications of High Definition VTR for Consumer Use". Part of the specifications are shown in table 2.

TABLE 2

| Recording system | Video signal | Sequential color difference lines Y/C time-domain multiplexing Frequency modulation recording |
|---|---|---|
| | Audio signal | PCM recording |
| Drum diameter | 62 mm | |
| Drum revolution | 60 rps | |
| Relative speed | 11.65 m/sec | |

Base band signals (Y, PB, PR) of the high definition television have a wide bandwidth. In order to record these signals efficiently, luminance signals and line-sequence color difference signals are time domain-multiplexed (TDM) to become TDM signals having a bandwidth of about 14 MHz: They are then D/A converted, subjected to emphasis processing and frequency modulated. These signals are recorded onto a magnetic tape in 2-channel, 2-segment format and reproduced from it by means of four (two pairs of) heads with each pair opposing to each other separated by 180° on a drum measuring 62 mm in diameter which rotates at a revolution speed of 3600 rpm.

Conventional video signal recording/reproduction apparatuses are made to different specifications for the two types of video information which are incompatible to each other, such as the above NTSC and HD baseband signals. For example, the VHS system may be composed by using two heads, while HD VTR requires four heads with the drum rotating at twice higher speed. Consequently, video information of the above two types cannot be handled in a single deck. Moreover, because the bandwidths used in recording signals in the two systems greatly differ, it is difficult to commonly use key parts such as the head and the drum for the two systems. Thus manufacture of different apparatuses requires different production lines dedicated to the respective systems, resulting in high production costs.

SUMMARY OF THE INVENTION

One object of the invention is to provide a video signal recording/reproduction apparatus capable of recording two kinds of video signals which are not in a ratio of integers.

Another object of the invention is to provide a video signal recording/reproduction apparatus capable of recording different kinds of video signals over the same period of recording time and minimizing the increase in the recording density.

Yet another object of the invention is to provide a video signal recording/reproduction apparatus capable of recording additional information in addition to the video signals with substantially the same recording density and the same recording time.

A still further object of the invention is to provide a video signal recording/reproduction apparatus capable of recording and reproduction of video signals of different types with the same deck system.

The video signal recording/reproduction apparatus of the first invention of this application has first video signal (present video signal) recording tracks wherein at least audio sectors and video sectors constitute one track, thereby N (N is a real number greater than 1) times the number of tracks than that used in recording present video signals are used when recording the second video signals (HD video signal), and tracks which include no audio sectors are provided. The video signal recording/reproduction apparatus is capable of adjusting the number of audio signal channels to make the HD video signal rate non-integer times the present video signal rate.

The video signal recording/reproduction apparatus of the first invention, when recording HD video signals, uses twice the number of tracks than that used in recording the present video signals, and has tracks wherein video signals are recorded in the audio sectors. Therefore, it is capable of recording HD video signals at twice or higher rate by recording video signals in the audio sectors despite the fact that twice the number of tracks as used in recording the present video signals are used.

The video signal recording/reproduction apparatus of the first invention, when recording HD video signals, uses twice the number of tracks that are used in recording the present video signals, and has two or more kinds of HD video signal error-correcting codes in tracks wherein no audio sectors are included. Therefore, it is capable of recording HD video signals at twice or higher rate by having two or more kinds of HD video signal error-correcting codes despite the fact that twice the number of tracks are used as that used in recording the present video signals.

The video signal recording/reproduction apparatus of the second invention of this application is provided with a first error correction encoding means which applies error correction encoding to the first video signals (present video signal) having less amount of information in the code structure of the product of C1(n1, k1) and C2(n2, k2); a second error correction encoding means which applies error correction encoding to the second video signals (HD video signal) having greater amount of information in the code structure of the product of C1(n1+m1, k1+m1) and C2(n2+m2, k2+m2); and a format circuit which prepares signals to be recorded corresponding to one recording track by combining s1 code words of the product code structure encoded by the first error correction encoding means and prepares signals to be recorded corresponding to one recording track by combining s2 code words of the product code structure encoded by the second error correction encoding means, and selects m1, m2 and s2 which approximately satisfy the relationship k1k2s1r=(k1+m1) (k2+m2)s2 (r is the ratio of the second video signals to the first video signals in the amount of information). In the recording of the second video signals which involve greater amount of information, the video signal recording/reproduction apparatus of the second invention does not change the number of checks for error-correcting codes. It increases only the amount of signals to suppress the increase in the amount of information to be recorded. This thereby suppresses the increase in the recording density compared to that in the case wherein the recording density is simply increased twofold. This make it possible to record video signals having information of two different kinds for the same period of time, without need to increase the recording density by the ratio of the amount of information of two kinds.

The video signal recording/reproduction apparatus of the third invention of this application is provided with an error correction encoding means which applies error correction encoding to the video signals and the additional information in the code structure of the product of C1(n1+m1, k1+m1) and C2(n2+m2, k2+m2) wherein the number of information symbols is increased by m1 and m2; and a formatting circuit which prepares signals to be recorded corresponding to one recording track by arranging s2 code words of the product code structure, and selects m1, m2 and s2 which approximately satisfy the relationship n1n2s1=(n1+m1) (n2+m2)s2. When recording additional information in addition to the video signals, because the number of information symbols is increased to correspond to the additional information to record the information encoded by the error-correcting codes of elongated code length and the same number of checks, additional information can be recorded together without reducing the recording time nor significantly changing the recording density.

The video signal recording/reproduction apparatus of the fourth invention of the application has an encoding means to make the shortest recording wavelength the same for all kinds of information when recording different kinds of video information. Because signals are encoded in such a manner that the shortest recording wavelengths for the information to be recorded on a tape are the same for different kinds of video information, it is possible to record and reproduce video information of two or more kinds with deck system of the same specifications.

The video signal recording/reproduction apparatus of the fifth invention of the application has a recording and encoding means to provide higher error correction capability for the video signals which include greater amount of information while maintaining the same shortest recording wavelength as that of another video information. Such a recording and encoding process provides higher error correction capability because more correction codes are added to the signals of higher recording density. This thereby enables it to compensate for the increase in the code detection errors accompanying the increasing recording density.

The above and further objects and features of the invention will more fully be apparent from the following detailed description with accompanying drawings.

BRIEF DESCRIPTION OF THE DRAWINGS

FIG. 15(b) is a block circuit diagram illustrative of the constitution of the reproduction system of another digital VTR of the invention.

DESCRIPTION OF THE PREFERRED EMBODIMENTS

The invention will be described in detail below with reference to the drawings illustrative of preferred embodiments, with particular emphasis on the home digital VTR.

Embodiment 1

Figure 5:
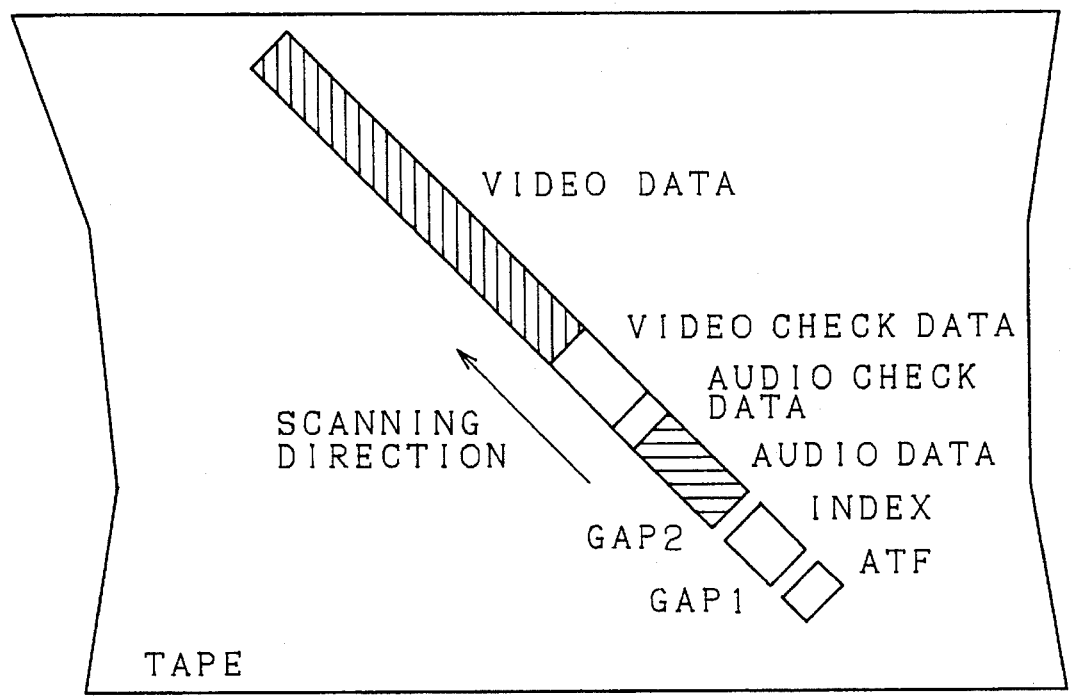
FIG. 5 is a tape format diagram for recording the present video signals.

FIG. 5, 6, 7 show the track patterns illustrative of an embodiment of the invention. FIG. 5 shows the track pattern to record the present video signals, wherein oblique tracks are formed by a magnetic head which scans from the bottom of the tape. Kinds of data are, from the bottom in order, ATF data (tracking servo data), INDEX data (program number or time data of video and audio signals), audio data, audio check data, video check data and video data. The audio data and the audio check data are collectively called the audio sector, and the video data and the video check data are collectively called the video sector. The ATF section and the INDEX section are provided with gaps 1 and 2, respectively, behind thereof, so that data sections separated by a gap may be rewritten (re-recordable) independently.

In a home digital VTR to record the present video signals, so-called 4:2:2 component video signals in accordance with the CCIR recommendation 601 are compressed to reduce the signal rate and recorded on a magnetic tape. About 216 Mbps of the 4:2:2 component video signal rate is compressed to about one eighth, 25 Mbps. Because recording of the digital video signals at a rate of 25 Mbps and digital audio signals on a magnetic tape of 6 mm or 8 mm in width requires about 1 to 2 $\mu m^2$ of area for each bit with the present level of magnetic recording technology, five to ten tracks are necessary to record one frame of video signals using a small drum with a diameter of 20 mm. The description that follows assumes that ten tracks are used to record one frame of video signals and audio signals.

Figure 11:
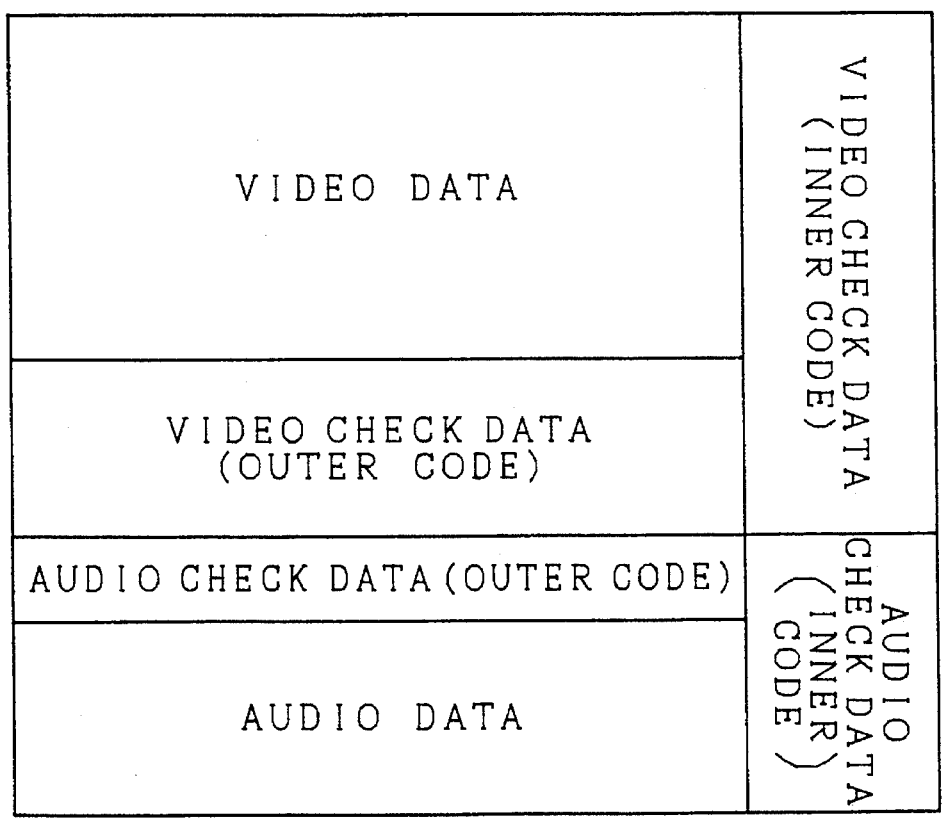
FIG. 11 is a schematic diagram illustrative of the structure of the error-correcting code used in recording the present video signals.

FIG. 11 illustrates the structure of the audio and video sectors of FIG. 5. In FIG. 11, audio data and video data 1 are disposed in 2-dimensional arrangement and encoded into outer code (C2 encoding) and inner code (C1 encoding). Data is scanned from left bottom to the right and upward successively, to form the tracks shown in FIG. 5.

Figure 6:
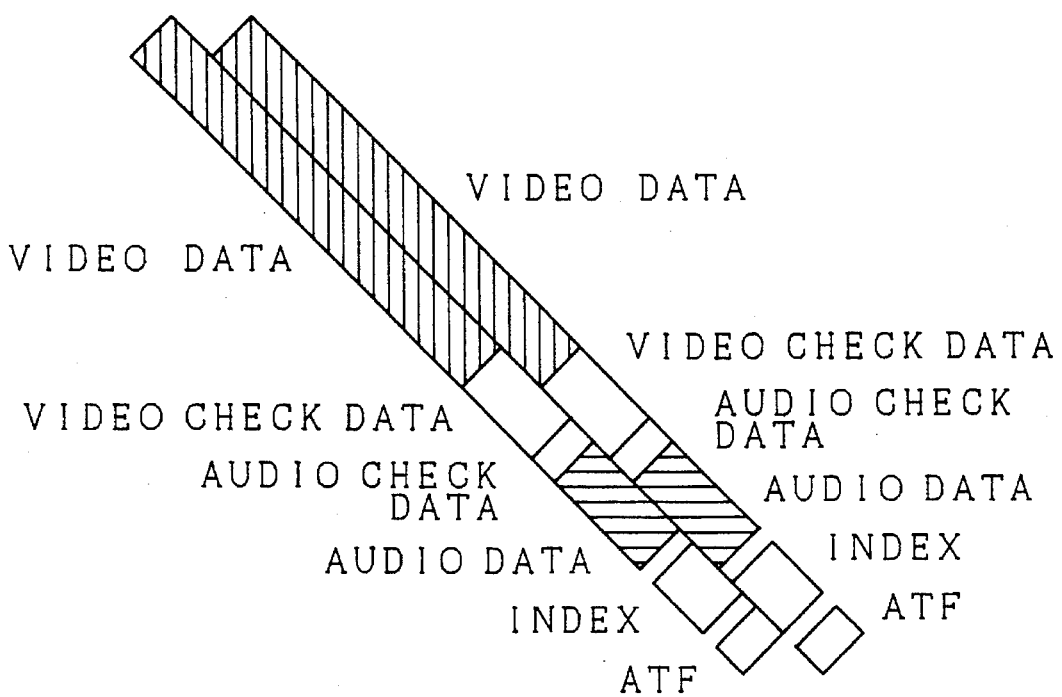
FIG. 6 is a tape format diagram for recording the HD video signals.

Therefore, one frame is made of ten tracks, and video signals of 25 Mbps and 2-channel audio signals can be recorded. Now a system to record HD video signals in addition to these signals will be discussed. Assuming that one frame of HD video signals are recorded in 20 tracks, the track format shown in FIG. 6 may first be conceived. This format consists of the tracks of FIG. 5 being simply placed side by side in a repeated manner, and allows to record 50 Mbps HD video signals and 4-channel audio signals.

Figure 7:
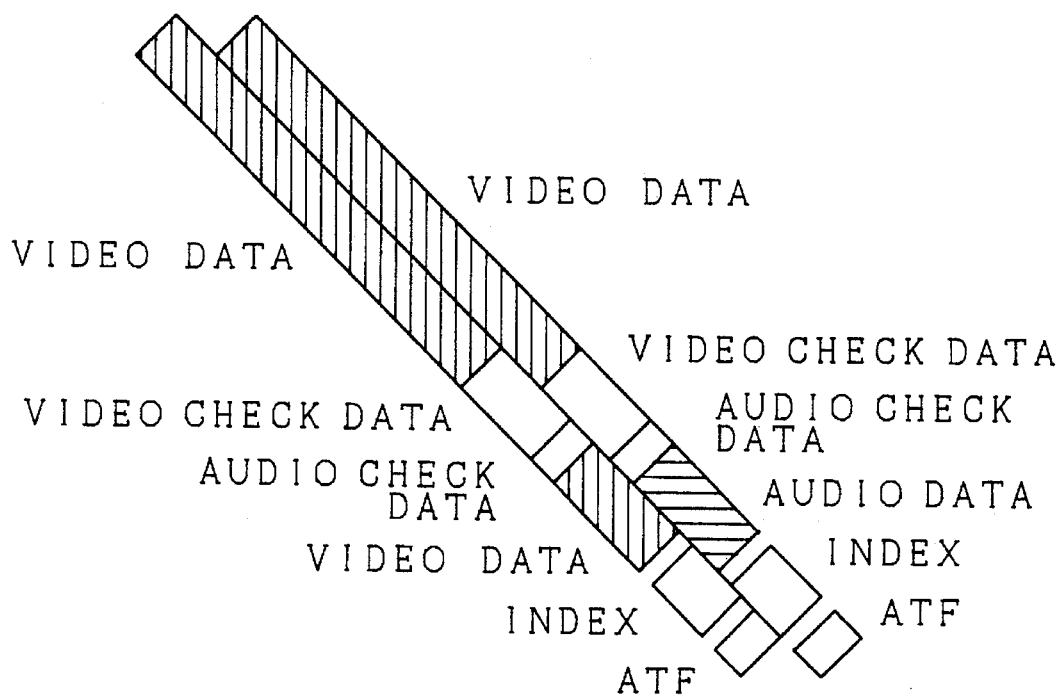
FIG. 7 is another tape format diagram for recording the HD video signals.

However, this track format requires the ratio of HD video signals to the present video signals be in a ratio of integers, and is not capable of handling signals in a ratio of non-integers. To accommodate information in non-integer ratio, the track pattern shown in FIG. 7 is considered. In FIG. 7, audio data and video data are recorded alternately without changing the error-correcting codes at all. In this case, 25×2=50 Mbps of video signals and about 1.5 Mbps of 2-channel audio signals, 51.5 Mbps of digital data in all, can be recorded.

Figure 12:
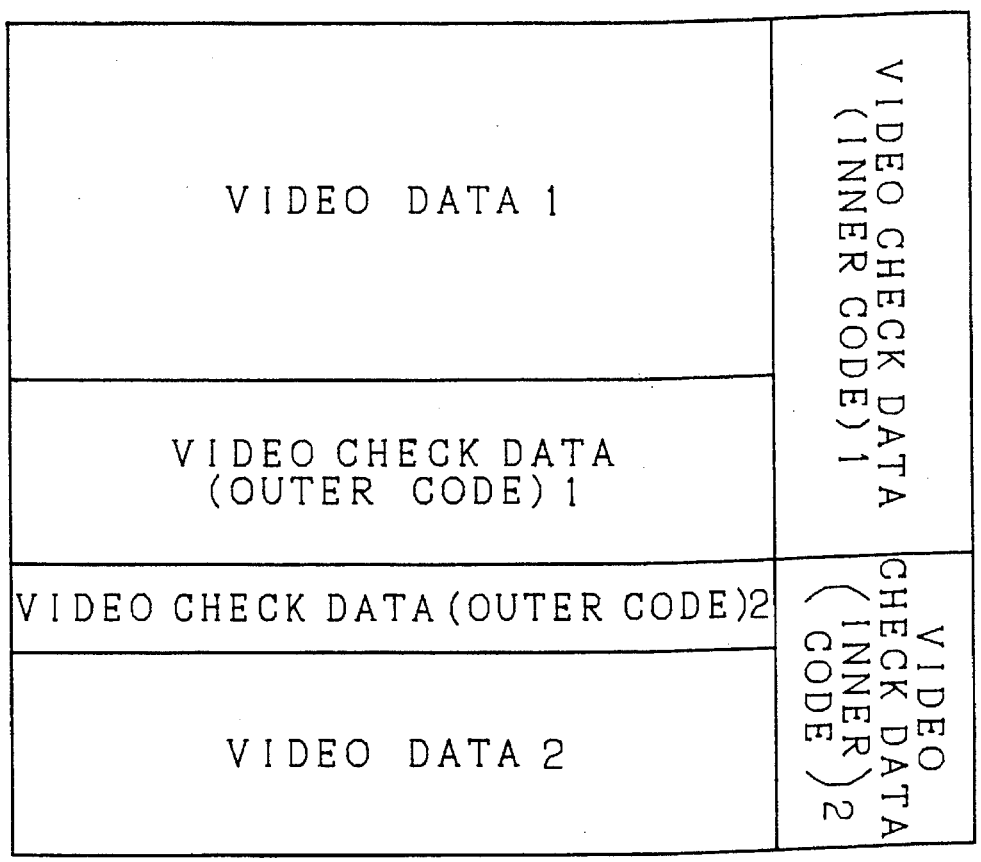
FIG. 12 is a schematic diagram illustrative of the structure of the error-correcting code used in recording the HD video signals.

At this time, a track where only the video data is recorded includes error-correcting codes of such a structure as shown in FIG. 12. That is, the portion corresponding to the audio area becomes the area to record the video data 2.

Embodiment 2

Figure 8:
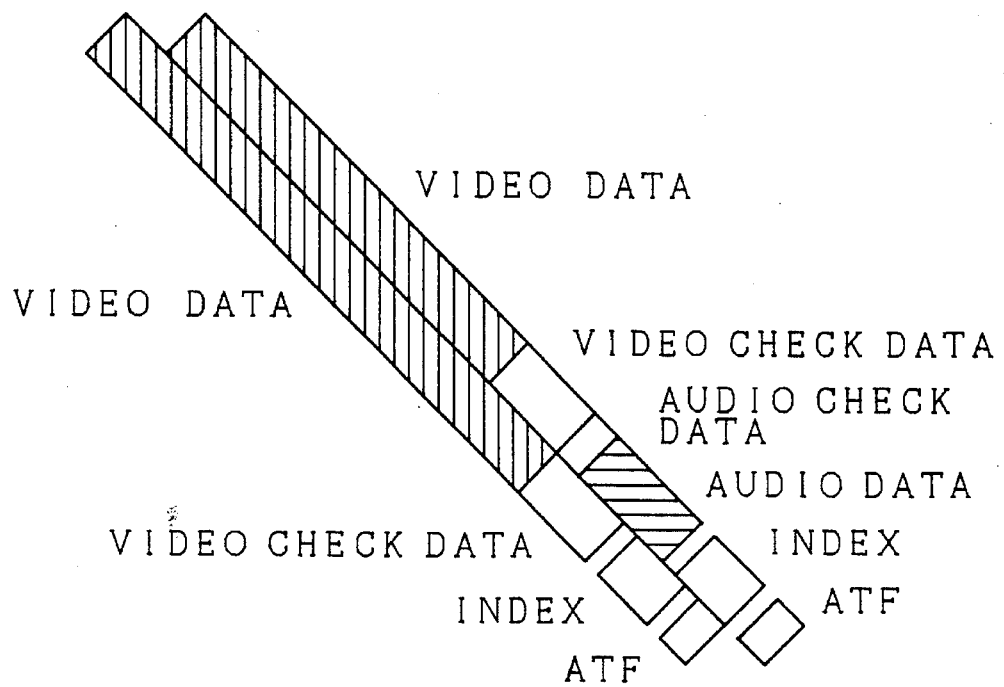
FIG. 8 is further another tape format diagram for recording the HD video signals.
Figure 13:
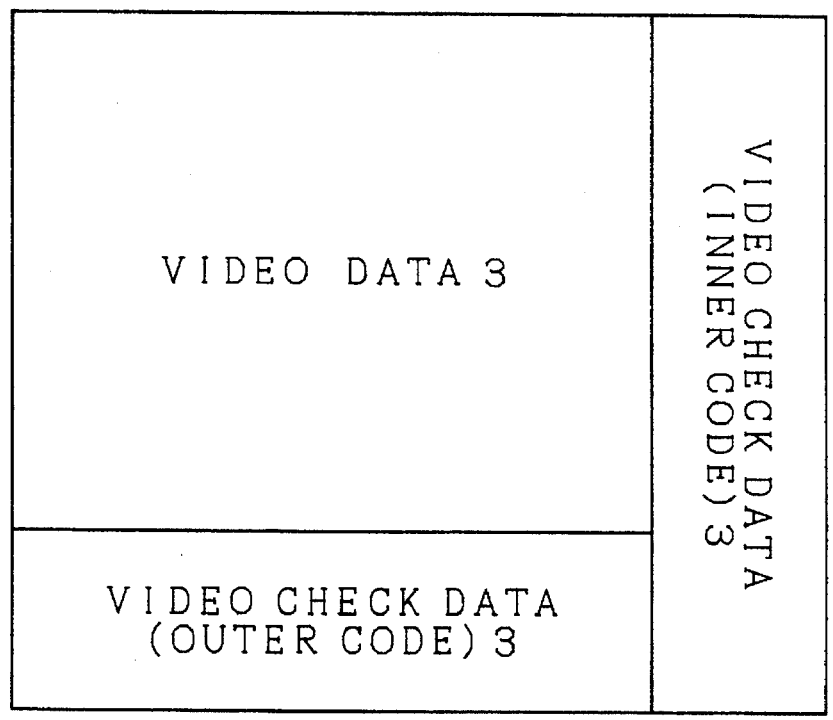
FIG. 13 is a schematic diagram illustrative of the structure of another error-correcting code used in recording the HD video signals.

A track pattern as shown in FIG. 8 is constructed. Namely, the structure of the error-correcting code of 10 out of 20 tracks of one frame is changed. In FIG. 8, audio area is eliminated and the information length of video data is made longer. At this time, because the portion of audio check data is used for video data, about 52 Mbps of digital video data in total can be recorded in contrast to that in FIG. 7. Error correction code in this case has such a structure as shown in FIG. 13. Namely, check codes are appended to the video data 3.

Embodiment 3

Figure 9:
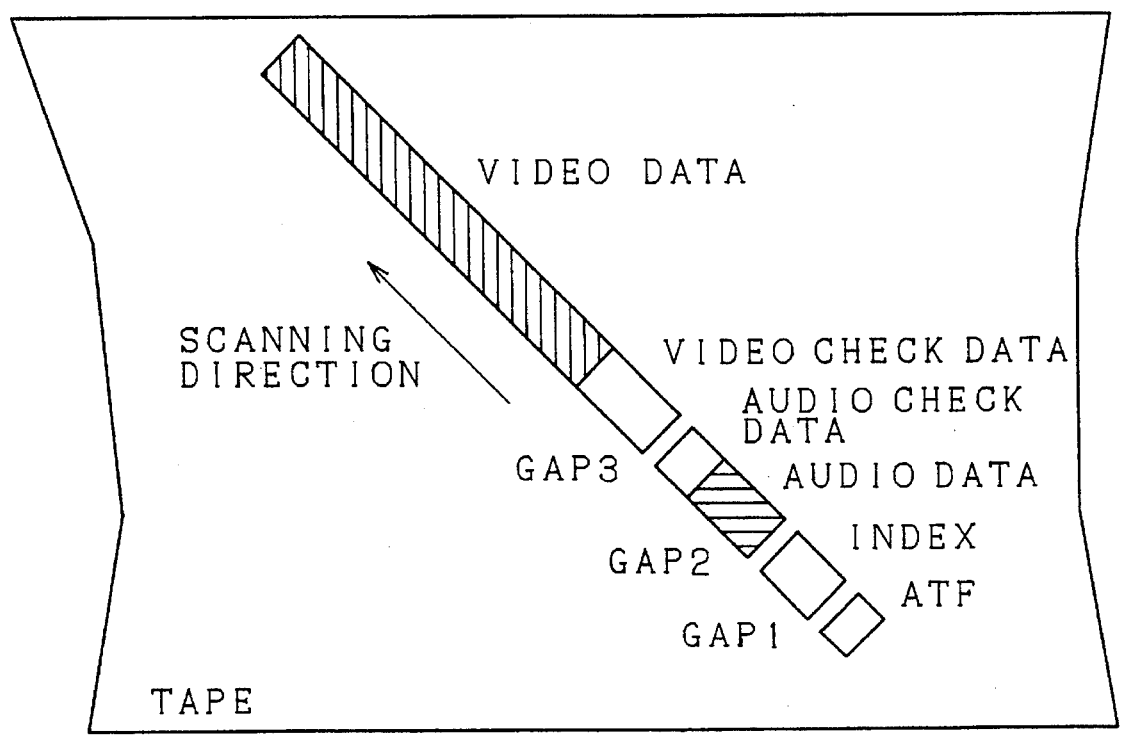
FIG. 9 is another tape format diagram for recording the present video signals.

Usually it may be conceived to provide a gap between a video area and an audio area. Although the gap makes it easier to re-record audio data and video data individually, it makes the track length a little longer than in the case without gaps. FIG. 9 shows an embodiment wherein present video signals are recorded.

Figure 10:
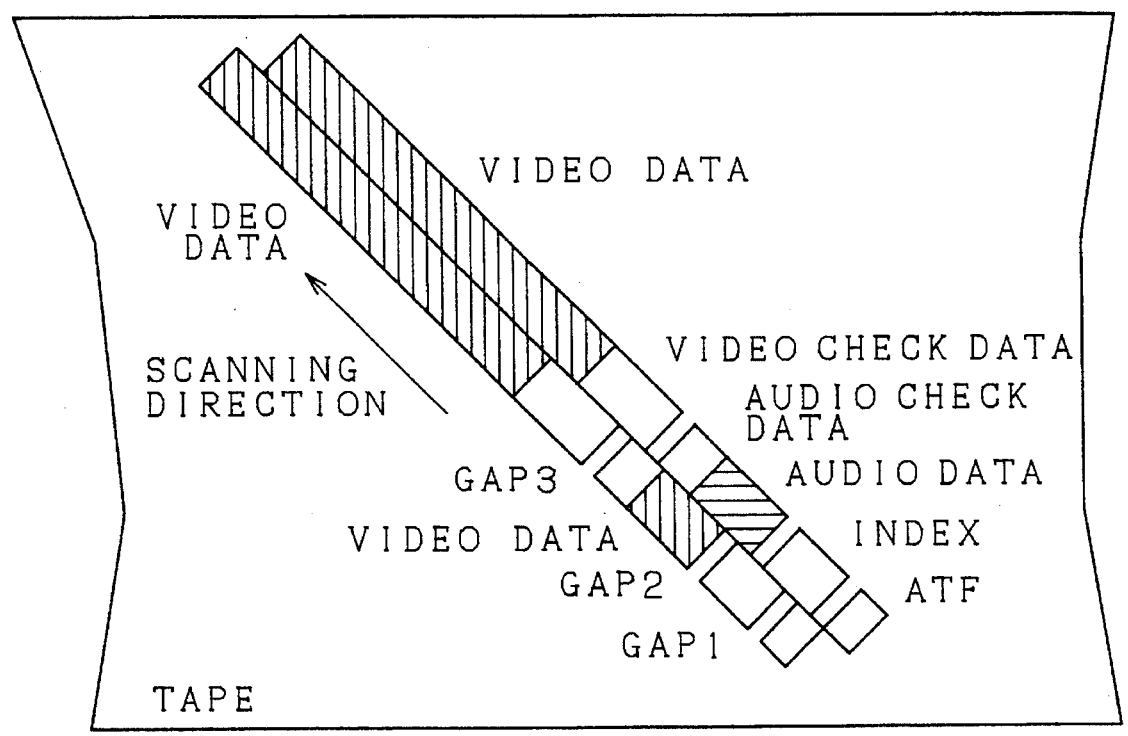
FIG. 10 is further another tape format diagram for recording the HD video signals.

FIG. 10 shows a track pattern for recording HD video signals, wherein audio data is recorded in 10 tracks out of 20 tracks of one frame and only the video data is recorded in the remaining 10 tracks. In this case about 51.5 Mbps of digital video data can be recorded.

Figure 14:
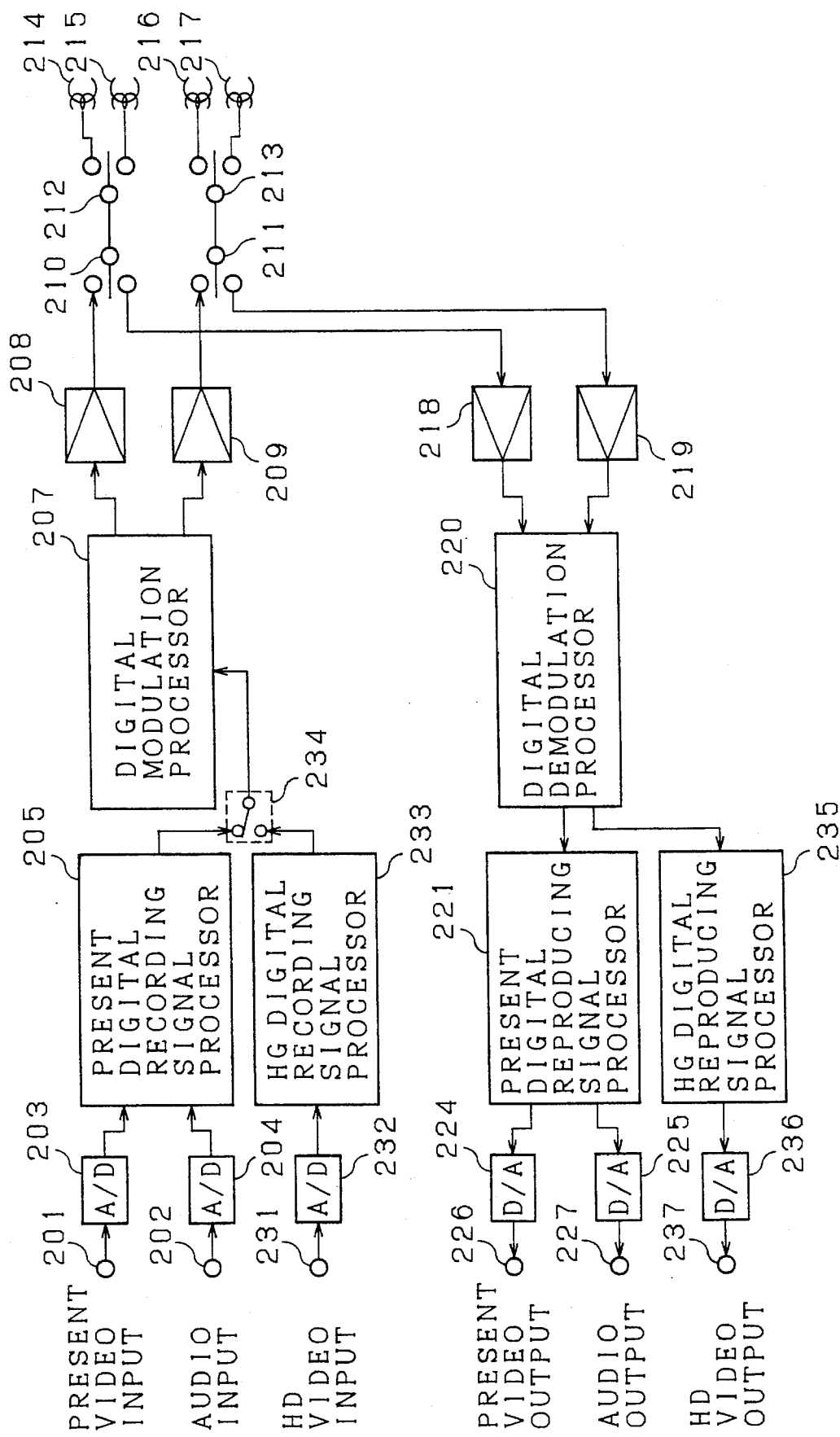
FIG. 14 is a block circuit diagram illustrative of the constitution of the digital VTR of the invention.

Now a home digital VTR which provides the track patterns of embodiments 1, 2, 3 will be described with reference to the schematic diagram. FIG. 14 is a schematic block diagram illustrative of the home digital VTR of the invention. In the drawing, 201 is an input terminal for the present video signals, 202 is an input terminal for audio signals, 231 is an input terminals for HD video signals, 203 is an A/D converter for the present video signals, 204 is an A/D converter for audio signals, 232 is an A/D converter for the HD video signals, 205 is a present digital recording signal processor, 233 is a HD digital recording signal processor, 234 is a switch for switching between the present video signals and HD video signals, 207 is a digital modulation processor, 208 and 209 are recording amplifiers, 210 and 211 are recording/reproduction selector switches, 212 and 213 are head selector switches, 214, 215, 216 and 217 are recording/reproduction heads, 218 and 219 are reproduction amplifiers, 220 is a digital demodulation processor, 221 is a present digital reproducing signal processor, 235 is a HD digital reproducing signal processor, 224 is a D/A converter for the present video signals, 225 is a D/A converter for audio signals, 236 is a D/A converter for HD video signals, 226 is an output terminal for video signals, 227 is an output terminal for audio signals, and 237 is an output terminal for HD video signals.

Operation will now be described with reference to FIG. 14. First the operation of recording the present video signals will be described. 4:2:2 component video signals received through the input terminal 201 are sampled in the A/D converter 203 at sampling frequencies of 13.5 MHz for the luminance signals and 6.75 MHz for two kinds of color difference signals, thereby to be quantized into 8-bit digital signals. Audio signals received through the input terminal 202 are quantized at 48 KHz into 16-bit digital signals in the A/D converter 204. Although input signals are represented by one channel in the drawing for the sake of simplicity, actually there are 3 channels for video signals and 2 channels for audio signals. Video signals and 2-channel audio signals which have been digitized are fed to the present digital recording signal processor 205.

In the present digital recording signal processor 205, video signals are image-compressed to reduce the data rate of video signals, necessary time-domain processing are applied to the image-compressed video signals and 2-channel audio signals, and the data is divided and assigned to 10 tracks for each frame. Then error correction encoding is carried out in the unit of a track, while encoding is applied separately to the video signals, audio signals and INDEX signals. INDEX signals to be recorded include such data as the signals used in searching and the number of audio signal channels. A train of data with the correction codes shown in FIG. 11 or FIG. 13 being appended thereto is sent to the digital modulation processor 207 via the switch 234. In the digital modulation processor 207, ATF signals are added to each track of data train sent from the present digital recording signal processor 205, and digital modulation is carried out according to the specified modulation rule. ATF signals may be added after modulation.

Output signals from the digital modulation processor 207 are routed through the recording amplifiers 208, 209 and the recording/reproduction selector switches 210, 211 and allocated to the heads 214, 215, 216, 217 by the head selector switches 212, 213, thereby to be recorded onto a magnetic tape in the tape pattern shown in FIG. 5 or FIG. 9.

Reproduction of signals is carried out as described below. Signals reproduced by the respective heads are routed through the head selector switches 212, 213 and the recording/reproduction selector switches 210, 211 to the reproduction amplifiers 218, 219 where they are amplified, then fed to the digital demodulation processor 220. The digital demodulation processor 220 extracts ATF signals from each track and sends them to the servo circuit which is not shown in the drawing, and applies digital demodulation to the data train from each track. A data train which has been subjected to digital demodulation is sent to the present digital reproducing signal processor 221.

The present digital reproducing signal processor 221 applies error correction to the data train which has been entered after digital demodulation. The video signals extracted as described above are restored into the original video signals through compression demodulation. Similarly the 2-channel audio signals are restored into the original 2-channel audio signals through specified time-domain processing.

Video signals sent from the present digital reproducing signal processor 221 are D/A converted by the D/A converter 224 to obtain the original present video signals. Audio signals are D/A converted by the S/A converter 225 to obtain the original 2-channel audio signals.

Operation of recording the HD video signals will now be described below. The HD video signals fed through the input terminal 231 are A/D converted by the D/A converter 232. It is assumed here that the HD video signals have luminance signal bandwidth of 20 MHz and color difference signal bandwidth of 5 MHz, which are quantized into 8-bit data at sampling rates of 40.5 MHz and 10.125 MHz, respectively, as a home use apparatus. This leads to the total bit rate of 486 Mbps. Digitized data is image-compressed in the HD digital recording signal processor 233 to reduce the bit rate to about 51.5 to 52 Mbps. After being subject to necessary time-domain processing, the data is allocated to 20 tracks in each frame. The switch 234 carries out time-division multiplexing operation by selecting the HD video data or the audio data. Selected data is entered to the digital modulation processor 207 where ATF signals are added to it, to form the track pattern as shown in FIG. 7, 8, 10.

When processing the HD video signals, the portion that follows the digital modulation processor 207 operates at a processing speed two times higher than that during processing of present video signals. Therefore speed control is carried out to double the drum revolution speed in the example shown in FIG. 14.

In the reproduction system, data which has been demodulated in the digital demodulation processor 220 is separated into audio signals and HD digital data, while the audio data is sent to the present digital reproducing signal processor 221 and the HD digital data is sent to the HD digital reproducing signal processor 235. The HD digital reproducing signal processor 235 restores the original digital HD video data through compression decoding processing. HD video signals are converted to analog signals by the D/A converter 236 and are provided as output from the output terminal 237.

Although the ratio of HD video signals to present signals is set at around 2 in this embodiment, it may be set at around 3, 4 or any other integer.

Also this embodiment is constructed so that 2-channel audio signals are recorded without signal compression, although they may be recorded after audio signal compression and they may be 4-channel signals instead of 2-channel signals. If four channels are used, recording rate of the HD video signals can be further increased.

Also HD video signals are recorded by changing only the audio area and the video area in this embodiment, but recording rate of the HD video signals can be further increased if the INDEX area and the ATF area are used. This may be achieved by recording INDEX signals and ATF signals every other track.

Also the drum is made to rotate at twice higher revolution speed when recording HD video signals in this embodiment, but it is not necessary to increase the drum revolution speed if twice the number of heads are used and skip recording is employed wherein present video signals are recorded every other revolution of the drum.

Also 4:2:2 component video signals are handled as the present video signals entered to the input terminal 201 in this embodiment. Further, however, the so-called composite video signals or other may be employed wherein the signals are quantized into 8-bit digital signals at the fourfold subcarrier frequency (14.318 MHz) by the A/D converter 203.

Embodiment 4

Figure 1:
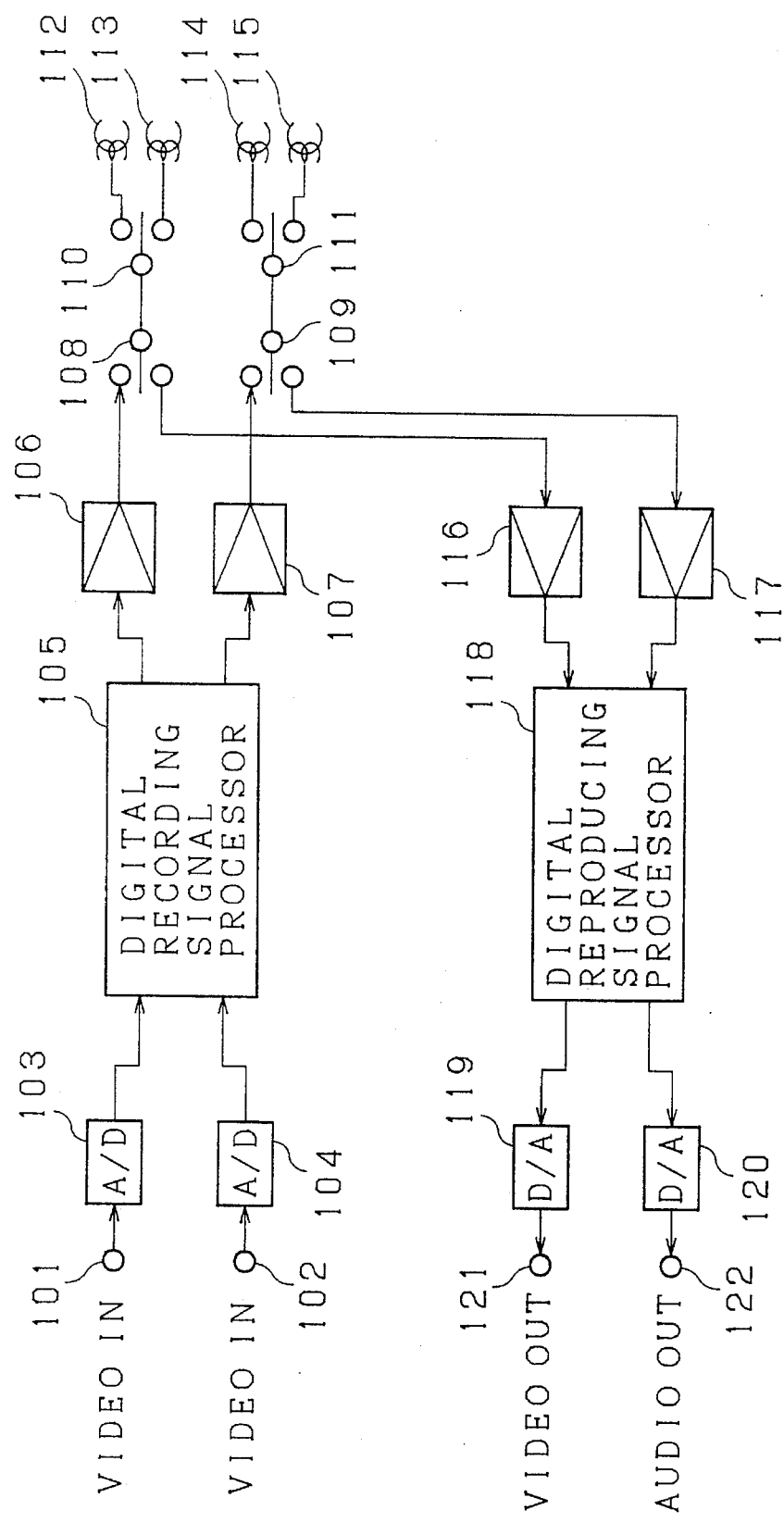
FIG. 1 is a block circuit diagram illustrative of the constitution of the D-2 system digital VTR of the prior art.
Figure 2:
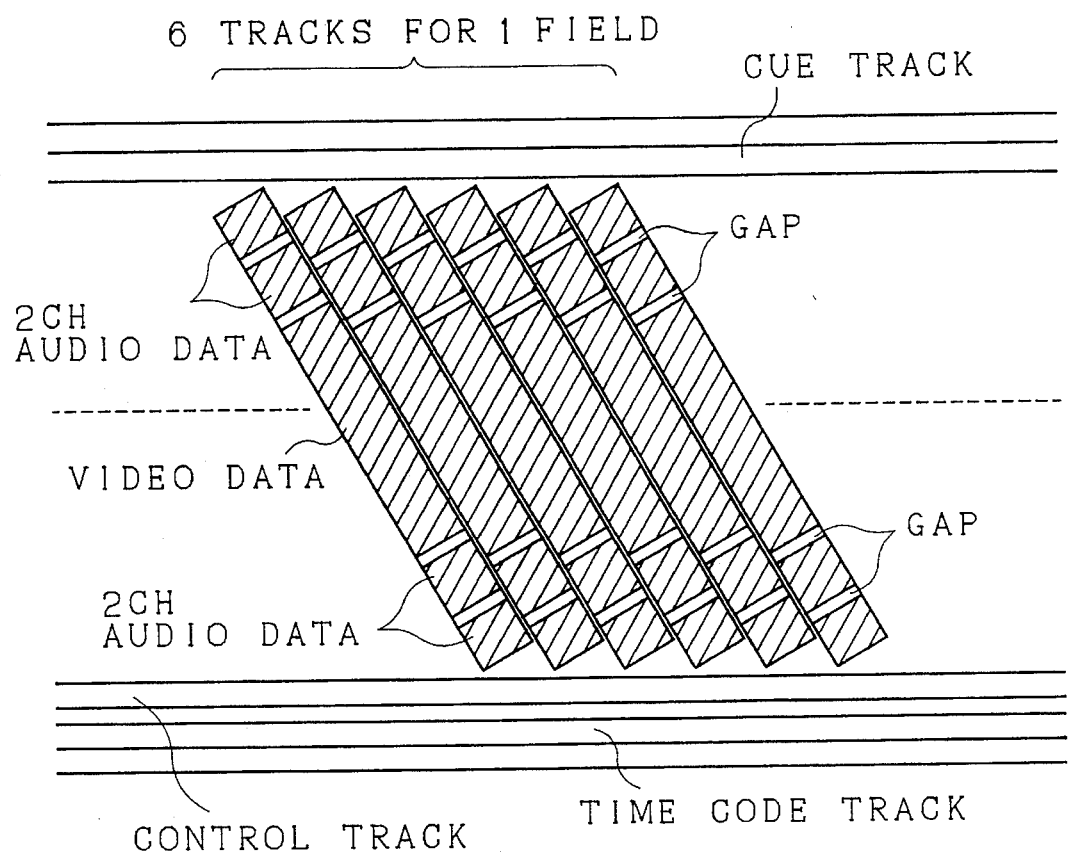
FIG. 2 is a tape format diagram for the D-2 system digital VTR of the prior art.
Figure 3A:
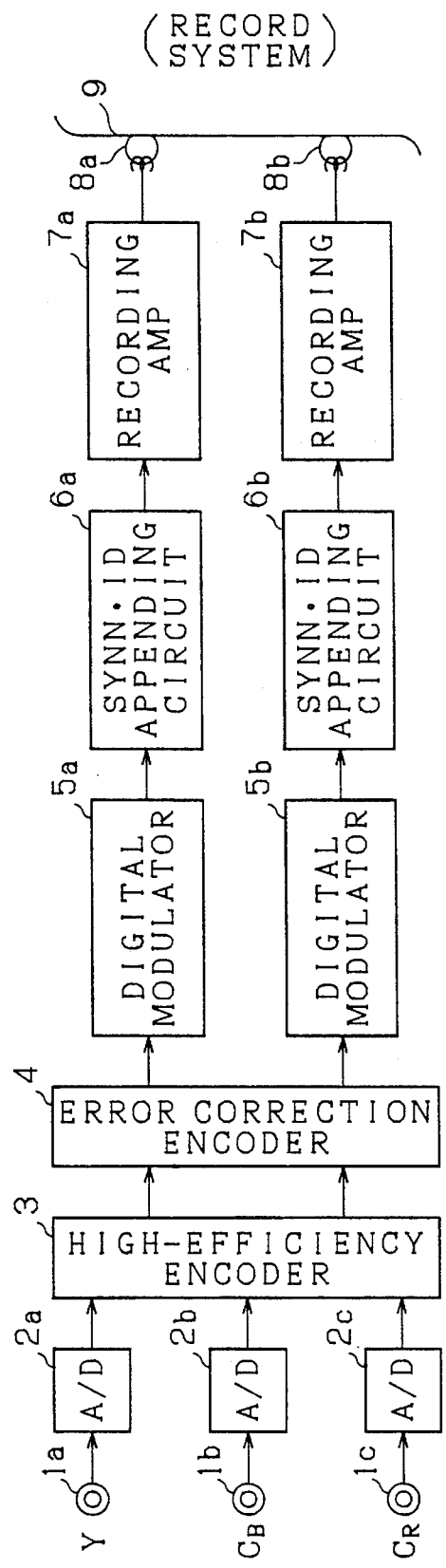
FIG. 3(a) is a block circuit diagram illustrative of the constitution of the record system of the digital VTR of the prior art.
Figure 3B:
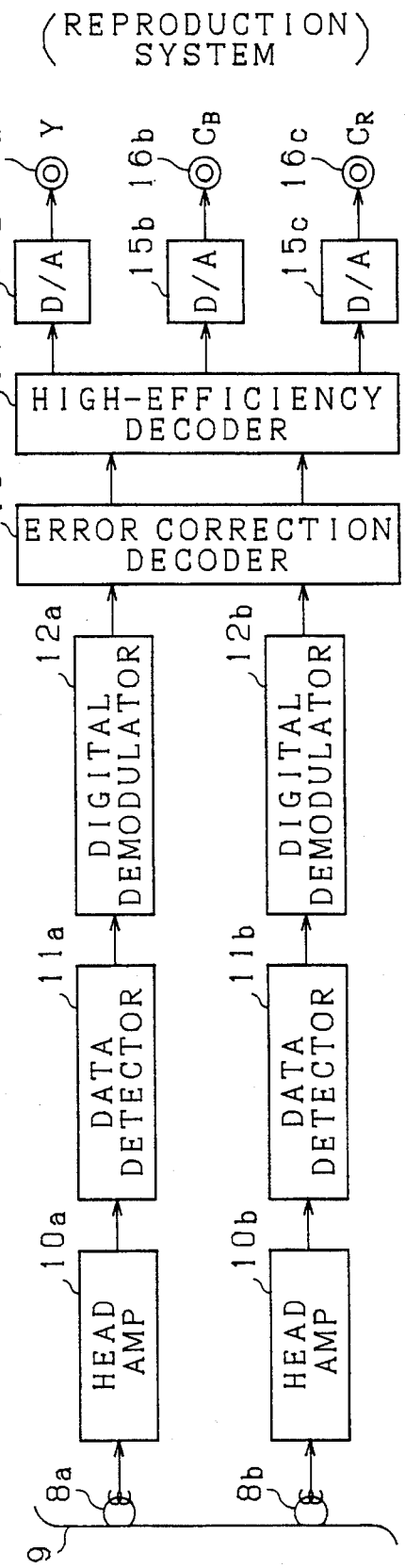
FIG. 3(b) is a block circuit diagram illustrative of the constitution of the reproduction system of the digital VTR of the prior art.
Figure 4:
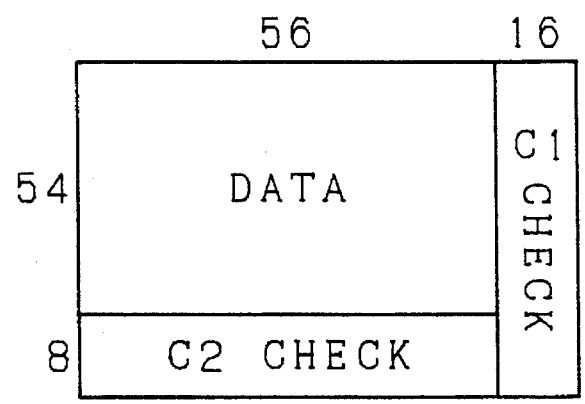
FIG. 4 is a schematic diagram illustrative of the structure of the error-correcting code used in the digital VTR of the prior art.
Figure 15A:
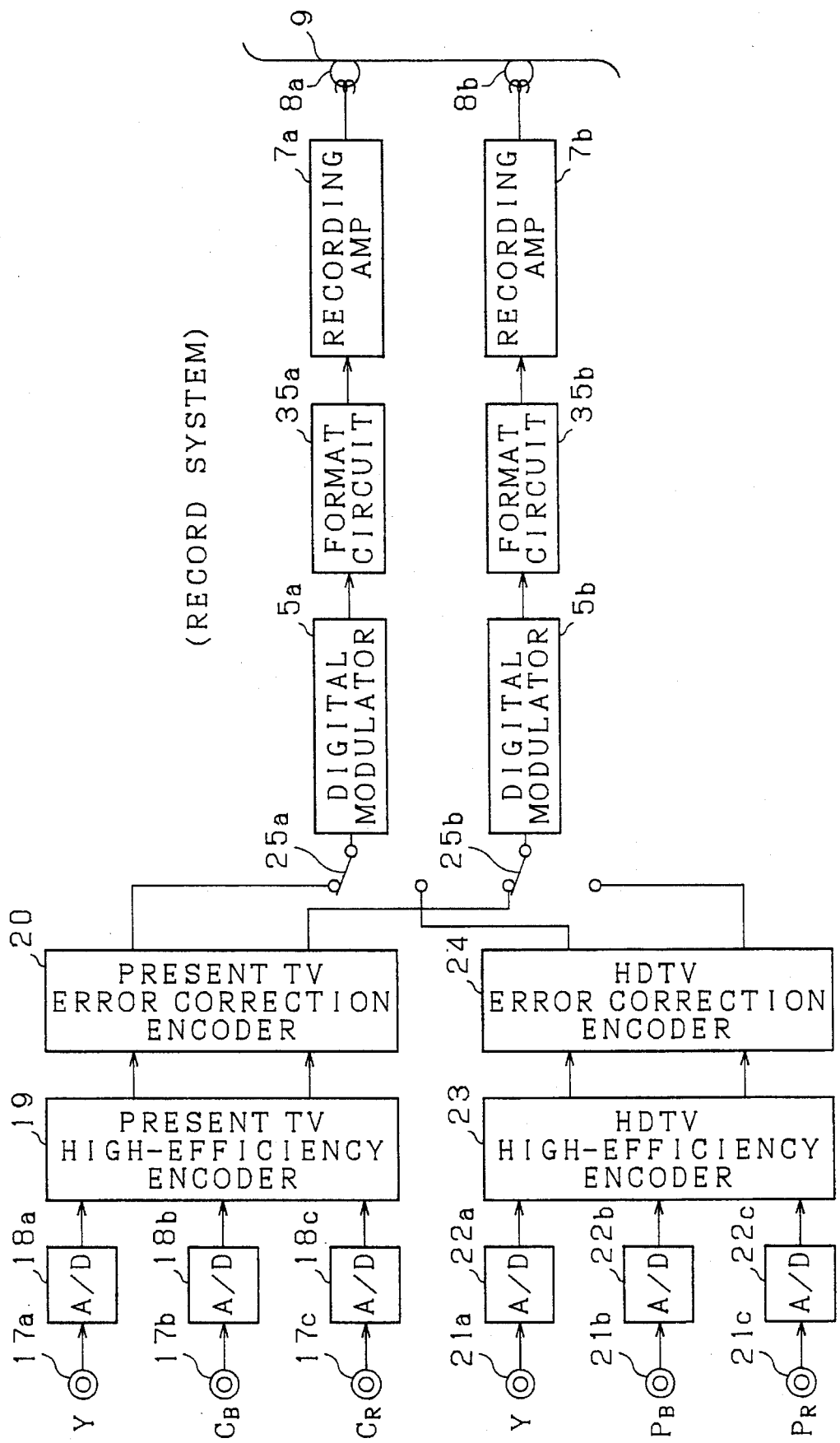
FIG. 15(a) is a block circuit diagram illustrative of the constitution of the record system of the digital VTR of the invention.

Embodiment 4 will now be described below. FIG. 15(a), (b) show the construction of the digital VTR of embodiment 4. Numerals used in FIG. 15(a), (b) which are the same as those in FIG. 3 denote the same components. In FIG. 15(a) which illustrates the construction of the record system, numerals 17a through 17c denote input terminals for the present TV signals, numerals 18a through 18c denote A/D converters which convert analog data to digital data, numeral 19 denotes a present TV high-efficiency encoder which applies high-efficiency encoding to the input luminance signal Y and the color difference signals CB and CR of the present TV signals, numeral 20 denotes a present TV error correction encoder which appends error-correcting codes to 2-channel output data of the present TV high-efficiency encoder 19 for the detection or correction of errors generated during reproduction of data, numerals 21a through 21c denote input terminals for HDTV, numerals 22a through 22c denote A/D converters which convert analog data to digital data, numeral 23 denotes a HDTV high-efficiency encoder which applies high-efficiency encoding to the luminance signal Y and color difference signals CB and CR of the input HDTV signals, numeral 24 denotes HDTV an error correction encoder which appends error-correcting codes to 2-channel output data of the HDTV high-efficiency encoder 23 for the detection or correction of errors generated during reproduction of data, 25a, 25b are switches to select which of the present TV signal signals and HDTV signals are to be recorded, 35a, 35b are format circuits which prepare signals to be recorded corresponding to one track by combining 8 code blocks including synchronization signals and ID signals appended thereto when recording present TV signals, and prepares signals to be recorded corresponding to one recording track by combining eight code blocks including synchronization signals and ID signals appended thereto when recording HDTV signals.

In FIG. 15(b) which illustrates the construction of the reproduction system, 26a, 26b are switches which change the states thereof depending on which of the present TV signals and the HDTV signals are reproduced, 27 is a present TV error correction decoder which detects and corrects errors in the reproduced signals, 28 is a present TV high-efficiency decoder which applies high-efficiency decoding to the output of the present TV error correction decoder 27 to restore the video signals, 29a through 29c are D/A converters which convert digital signals to analog signals, 30a through 30c are output terminals for present TV signals, 31 is a HDTV error correction decoder which detects and corrects errors in the reproduced signals, 32 is a HDTV high-efficiency decoder which applies high-efficiency decoding to the output of the HDTV error correction decoder 31 to restore video signals, 33a, through 33c are D/A converters which convert digital signals to analog signals, 34a through 34c are output terminals for HDTV.

Figure 16A:
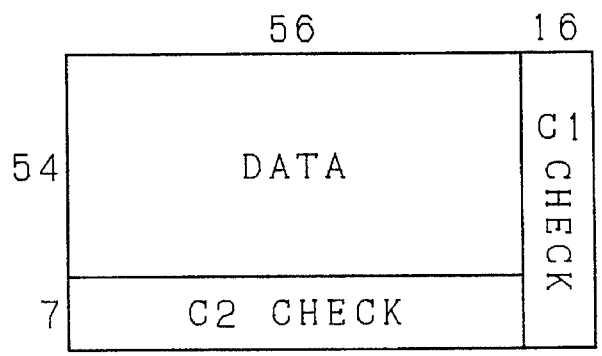
FIG. 16(a) is a schematic diagram illustrative of the structure of the error-correcting code of the present TV used in the digital VTR shown in FIG. 15.
Figure 16B:
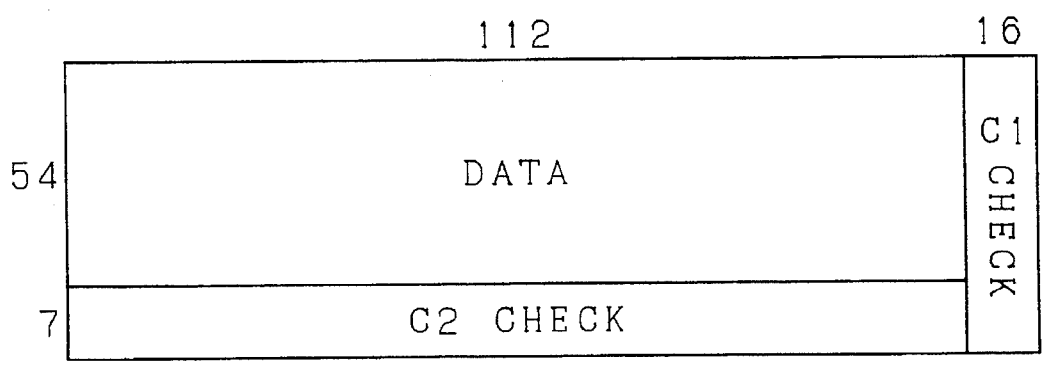
FIG. 16(b) is a schematic diagram illustrative of the structure of the error-correcting code of the HDTV used in the digital VTR shown in FIG. 15.

FIG. 16(*a*), (*b*) show the structure of code blocks of the present TV signals and HDTV signals. Structure of the code block of the present TV signals is the same as that of the prior art with a double RS code of C1 (72, 56, 17) and C2(61, 54, 8). Structure of the code block of HDTV signals is such that the number of checks for the codes of present TV signals is maintained the same and the number of information symbols of C1 codes is increased twofold with a double RS code of C1(128, 112, 17) and C2(61, 54, 8).

The operation will now be described below with reference to FIG. 15, FIG. 16. Present TV signals received through the input terminals 17a through 17c are subject to exactly the same processes as the prior art described above, and processed in the present TV high-efficiency encoder 19 to compress the amount of information. Compressed data is processed in the present TV error correction encoder 20 which appends error-correcting codes to the code blocks. HDTV signals received through the input terminals 21a through 21c are subject to processes similar to those in the prior art described above, and processed in the HDTV high-efficiency encoder 23 to compress the amount of information to twice the amount as that of present TV signals. Compressed data is processed in the HDTV error correction encoder 24 which appends error-correcting codes to the code blocks as shown in FIG. 16(*b*). The switches 25a, 25b determine which of the present TV signal and the HDTV signal is to be selected. Similarly to the prior art described above, the digital modulators 5a, 5b apply digital modulation. Digital-modulated recording signals are processed in the format circuits 35a, 35b which prepare recording signals of an amount corresponding to one track by combining a specified number of code blocks with synchronization signals and ID signals appended thereto depending on whether the signals are present TV signals or HDTV signals, whereupon the prepared recording signals are recorded on the magnetic tape 9.

When present TV signals and HDTV signals are recorded on the magnetic tape 9 in this manner, 8 code blocks are recorded in one recording track in the case of present TV signals, similar to the case of prior art. In the case of HDTV signals, because the amount of information is twice that of the present TV signals, 8 code blocks are recorded in one recording track assuming the recording time is the same as for the present TV signals.

Operation of the reproduction system will now be described below. After the reproduced signals are digital-demodulated similarly to the prior art, the switches 26a, 26b route the reproduced signals to the present TV error correction decoder 27 when the signals are present TV signals, or to the HDTV error correction decoder 31 when the signals are HDTV signals. When present TV signals are reproduced, the present TV error correction decoder 27 detects errors generated in the reproduced signals or corrects the errors based on the checks appended in advance during recording. Errors detected are subject to processes such as compensation. Reproduced signals with errors corrected or compensated are subject to a process similar to that of the prior art in the present TV high-efficiency decoder 28, with the original signals of present TV format being restored, converted to analog data by the D/A converters 29a through 29c to be provided as output on the output terminals 30a through 30c. When HDTV signals are reproduced, the HDTV error correction decoder 31 detects or corrects errors similar to the case of present TV signals, and the original HDTV signals are restored by the HDTV high-efficiency decoder 32, with the signals obtained being converted to analog data by the D/A converters 33a through 33c and provided as output on the output terminals 34a through 34c.

Figure 17:
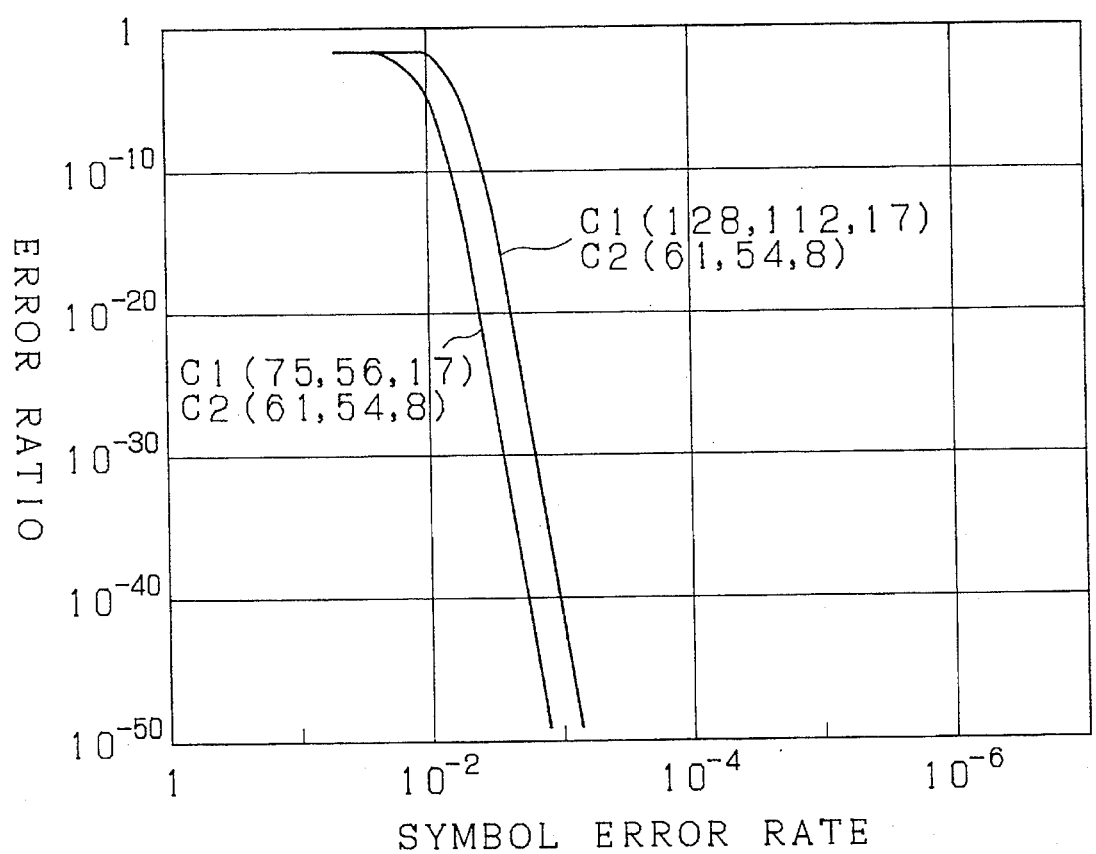
FIG. 17 is a graph representing the change in the error ratio of the error-correcting code used in the digital VTR shown in FIG. 15.

As described above, because the structure of the error-correcting codes and the recording density are changed between the present TV signals and HDTV signals to obtain the same recording time for both present TV signals and HDTV signals, recording density becomes 128/72=1.777... times that in the case of obtaining the same recording time by simply increasing the recording density two times higher. Increasing the code length causes the error ratio to change as shown in FIG. 17, showing that the error ratio of either code is at a negligible level when the symbol error rate is within $1 \times 10^{-3}$.

Figure 18:
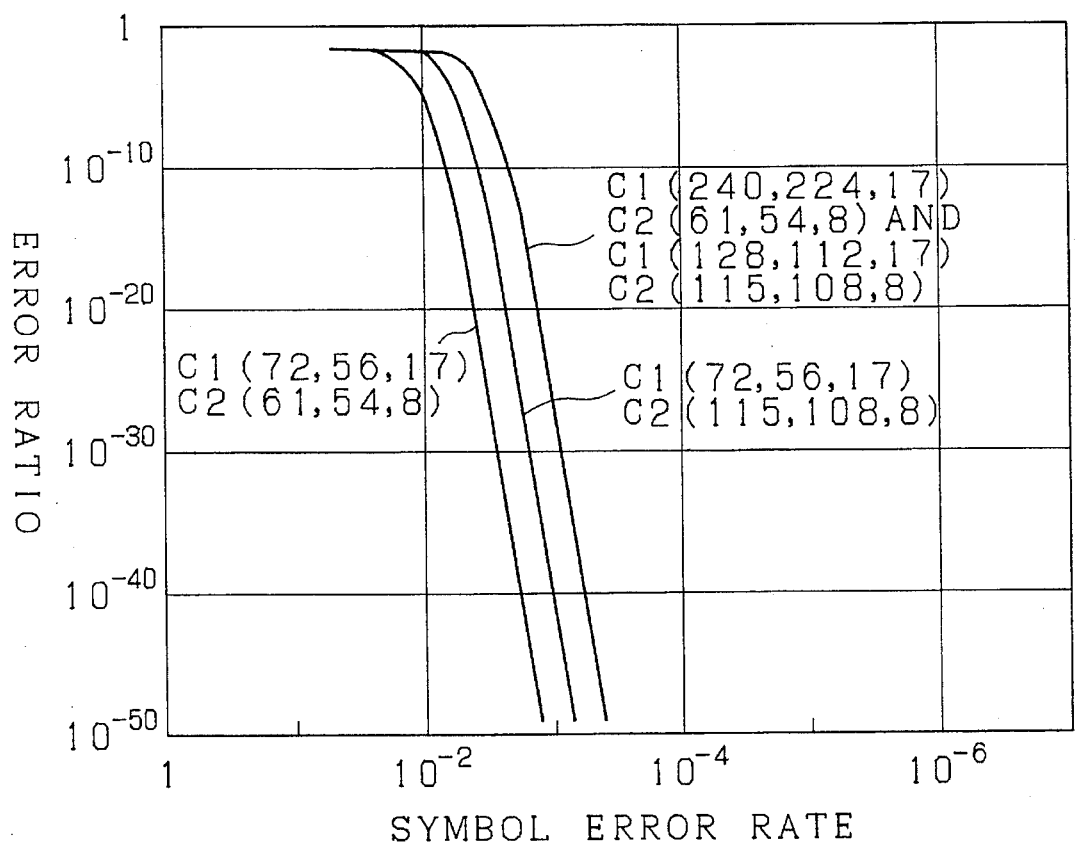
FIG. 18 is a graph representing the change in the error ratio of another error-correcting code used in the digital VTR shown in FIG. 15.

While the structure of the code blocks of HDTV signals wherein the number of information symbols is increased to twice that of C1 code of present TV signals in the above embodiment, a similar effect as that of the above embodiment may be obtained by increasing the number of information symbols of C1 codes four times to make the code structure of the HDTV signals to be double RS code of C1(240, 224, 17) and C2(61, 54, 8), wherein recording density becomes about 1.67 times. The error ratio in the case of respective code structure is shown in FIG. 18, showing that the error ratio of either code is at a negligible level when the symbol error rate is within $1 \times 10^{-3}$.

A similar effect as that of the above embodiment may also be obtained by increasing the number of information symbols of C2 codes two times to make the code structure of the HDTV signals to be a double RS code of C1(72, 56, 17) and C2(115, 108, 8), wherein recording density becomes about 1.89 times. The error ratio in this case is shown in FIG. 18, showing that the error ratio of either code is at a negligible level when the symbol error rate is within $1 \times 10^{-3}$.

When the number of information symbols of both C1 codes and C2 codes are increased twofold to make the code structure of the HDTV signals to be a double RS code of C1(128, 112, 17) and C2(115, 108, 8), a similar effect to that of the above embodiment can be obtained wherein recording density becomes about 1.68 times. The error ratio in this case is shown in FIG. 18, showing that the error ratio in this case is also at a negligible level when the symbol error rate is within $1 \times 10^{-3}$.

As described above, when the codes are constructed so that number of information symbols for the C1 codes of the HDTV signals is increased to n times that of C1 codes of present TV signals and the number of information symbols for the C2 codes of HDTV signals is increased to m times that of C2 codes of present TV signals (n and m are natural numbers) with the number of checks remaining the same, number of information symbols in one code block of HDTV signals corresponds to that of n×m code blocks of the present TV signals and, when number of checks included in n×m code blocks of the present TV signals and the number of checks included in one code block of HDTV signals are compared, it is clear that the present TV signals include more checks. Thus information for the number of checks corresponding to this difference can be eliminated, making it possible to minimize the increase in the recording density. An increase in the error ratio caused by increasing the code length remains at a negligible level when the symbol error rate is within $1 \times 10^{-3}$ as shown in the above embodiment.

While a case of recording video signals of two kinds of different amounts of information is described in the above embodiment, a similar effect can be obtained by increasing the number of information symbols and applying error correction encoding with the code structure of the same number of checks similar to the above embodiment, when recording the video signal and high definition data which has been omitted in the stage of high-efficiency encoding.

Also a similar effect can be obtained by increasing the number of information symbols and applying error correction encoding with the code structure of the same number of checks similarly to the above embodiment, when recording additional index signals which indicate the contents of video signals.

While a case of applying error correction encoding by employing different error correction encoding devices is described in the above embodiment, because the two kinds of codes are used whose numbers of information symbols are changed by using the shortened code with the same number of checks, the generator polynomials in use are identical and therefore error correction encoding devices of the same construction may be used. Consequently, if encoding is done with the appropriate number of information symbols according to whether the signals being processed are present TV signals or HDTV signals, the same error correction encoding devices may be used to reduce the scale of circuit.

Embodiment 5

Embodiment 5 of the invention will now be described below. FIG. 19(a), (b) show the construction of the digital VTR of embodiment 5. In FIG. 19(a), (b), numerals identical with those used in FIG. 3 denote the identical components. In FIG. 19(a) which shows the structure of the record system, numeral 36 denotes a high-efficiency encoder of such a structure that high-efficiency encoding is applied to the input luminance signal Y and the color difference signals CB and CR to obtain high definition data which has been omitted in the course of compressing to the specified amount of information. Numeral 37 denotes an error correction encoder which appends error-correcting codes to detect or correct errors generated during reproduction in the 2-channel data and the high definition data which are supplied from the high-efficiency encoder 36. Numerals 38a, 38b denote format circuits which generate one track of recording signals by combining four code blocks with synchronization signals and ID signals being appended thereto. In FIG. 19(b) which shows the construction of the reproduction system, numeral 39 denotes an error correction decoder which detects and corrects errors generated in the reproduced signals. Numeral 40 denotes a high-efficiency decoder which applies high-efficiency decoding to the output of the error correction decoder 39 and restores the video signals.

Figure 20:
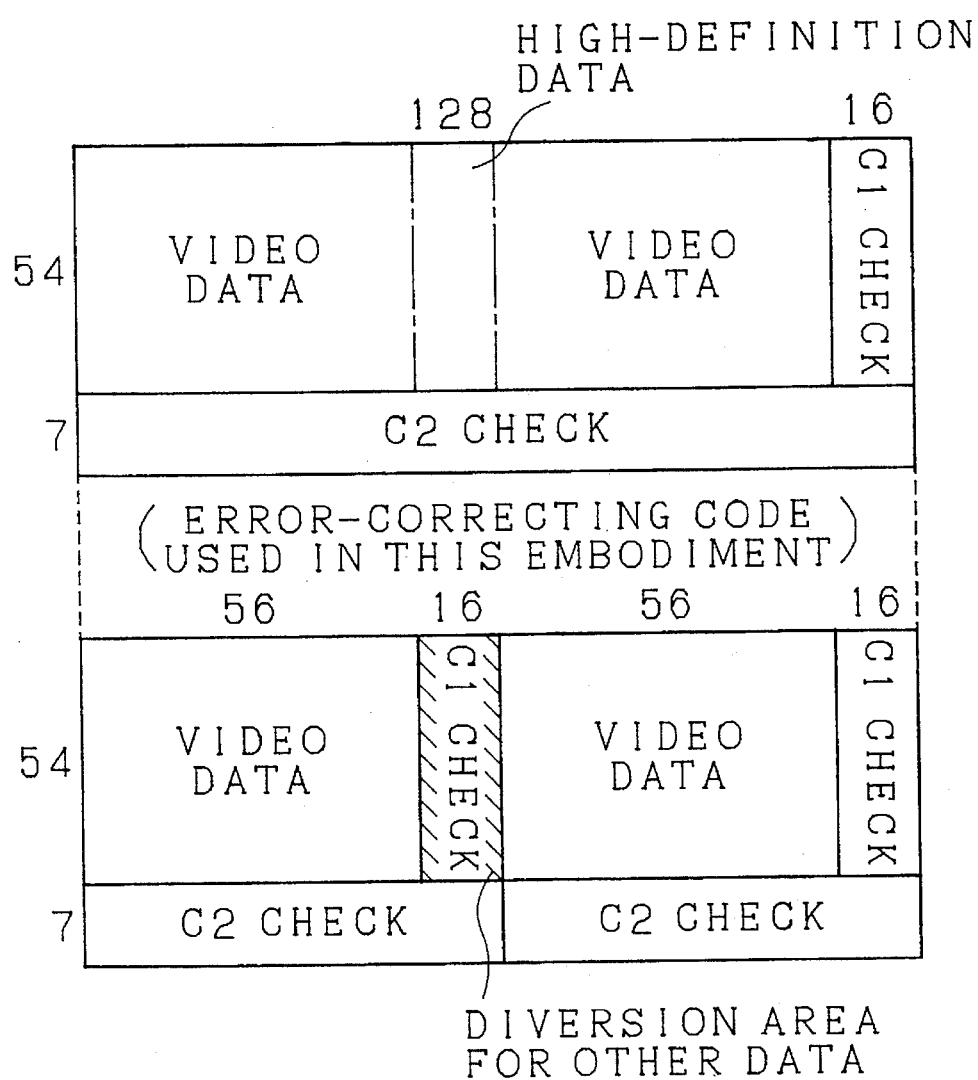
FIG. 20 is a schematic diagram illustrative of the structure of the error-correcting code used in the digital VTR shown in FIG. 19.

FIG. 20 shows the structure of the code block. The code block has the structure of double RS code of C1(144, 128, 16) and C2(61, 54, 8) where the code length is two times that of prior art and has the same number of checks.

Figure 19:
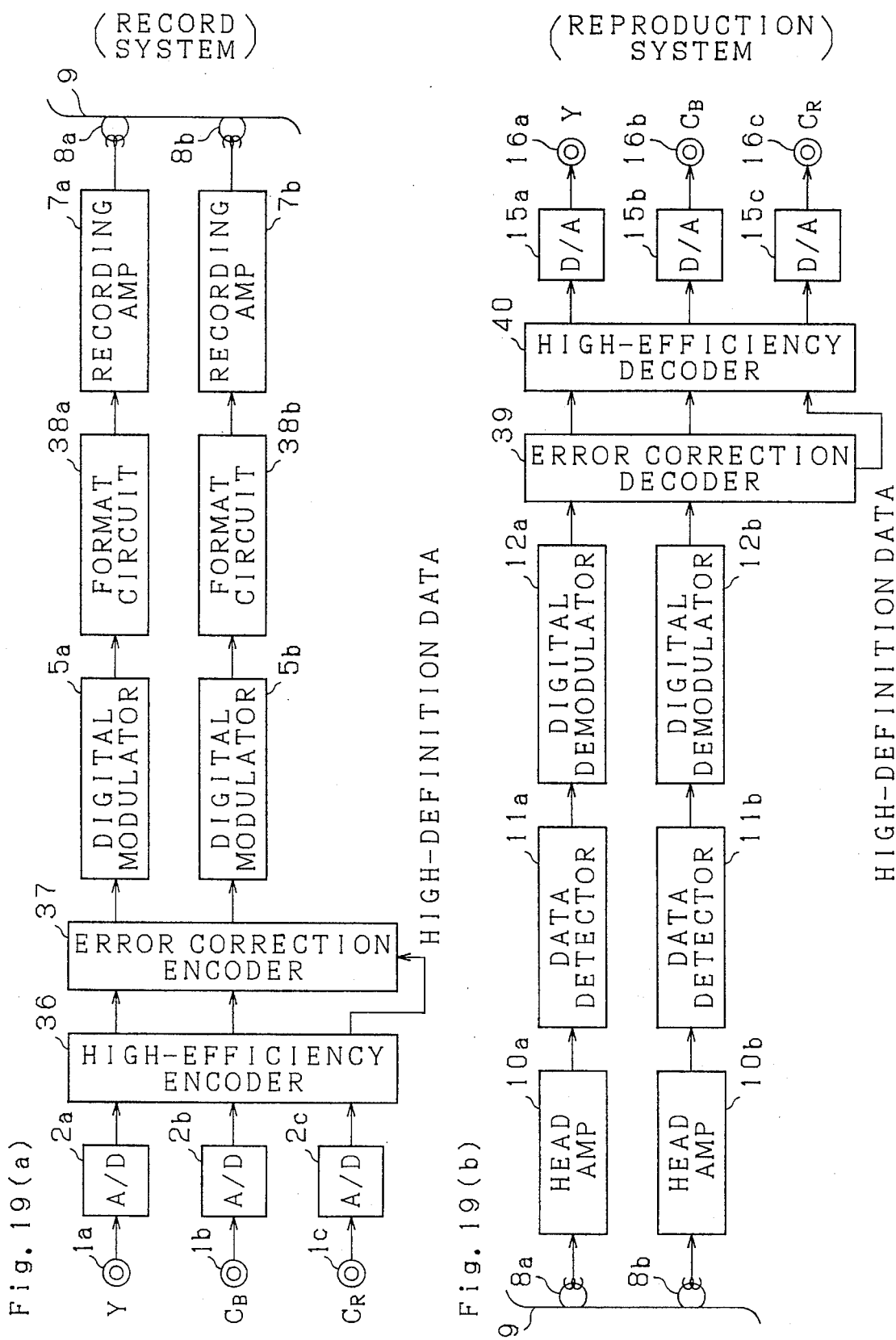
FIG. 19(a) is a block circuit diagram illustrative of the constitution of the record system section of further another digital VTR of the invention.
FIG. 19(b) is a block circuit diagram illustrative of the constitution of the reproduction system of further another digital VTR of the invention.

Operation will now be described below with reference to FIG. 19 and FIG. 20. Video signals received through the input terminals 1a through 1c are subject to exactly the same processes as the prior art described above, and processed in the high-efficiency encoder 36 to compress the amount of information with the high definition data of the video signals which has been omitted in the process of compressing the amount of information remaining. Compressed data and the high definition data are processed in the error correction encoder 37 which applies error correction encoding of the code block shown in FIG. 20. Signals are then digital-modulated in the digital modulators 5a, 5b in a manner similar to the prior art. Digital-modulated recording signals are processed in the format circuit 38a, 38b which generates recording signals for one track by combining four code blocks with synchronization signals and ID signals appended thereto, and are recorded on the magnetic tape 9.

Because error correction encoding is applied by combining two code blocks of the prior art into one code block and using code blocks with the same number of checks, it is possible to record data which corresponds to C1 check of one code block with other information, high definition data in this case (see FIG. 20). Also because all data including checks has no significant difference from that of prior art, high definition data can be recorded without changing the recording density.

Operation of the reproduction system will now be described below. After the reproduced signals are digital-demodulated in a manner similar to the prior art, the error correction decoder 39 detects or corrects errors generated in the reproduced signals based on the checks appended in advance during recording. Detected errors are subject to processes such as compensation. Video signals and high definition data of the video signals are separated from the reproduced signals with errors being corrected or compensated. In the high-efficiency decoder 39, video signals which have been rendered higher definition compared to the prior art based on the two sets of data are restored, which are then converted to analog data by the D/A converter 15a through 15c and provided as output at the output terminals 16a through 16c. An increase in the error ratio caused by increasing the code length remains at a negligible level when the symbol error rate is within $1 \times 10^{-3}$ as shown in embodiment 4.

While a case of using C1 codes with twice the code length as that of the prior art is described, high definition data can be recorded without changing the recording density in a manner similar to the above embodiment, by increasing the code length of C1 codes four times to employ a double RS code of C1(255, 239, 16) and C2(61, 54, 8) for the code structure. This is almost the same as the code block structure wherein one code block is obtained by combining four code blocks of the prior art with the same number of checks, and therefore other information, high definition data in this case, corresponding to the C1 checks of three code blocks can be recorded. The error ratio is at a negligible level when the symbol error rate is within $1 \times 10^{-3}$.

A similar effect as that of the above embodiment may also be obtained by increasing the number of information symbols of C2 codes two times to make the code structure of double RS code of C1(72, 56, 17) and C2(122, 115, 8), because it makes the same code block structure as that wherein one code block is obtained by combining two code blocks of the prior art with the same number of checks. Therefore high definition data corresponding to the C2 checks of one code block can be recorded. The error rate in this case is at a negligible level when the symbol error rate is within $1 \times 10^{-3}$.

Similar effects as that of the above embodiment may also be obtained by increasing the number of information symbols of C1 codes two times and increasing the number of information symbols of C2 codes two times to make the code structure of C1 (144, 128, 17) and C2 (122, 115, 8). The error ratio in this case is at a negligible level when the symbol error rate is within $1 \times 10^{-3}$.

As described above, when such a code structure is employed as the code length of C1 codes is increased n times and the code length of C2 codes is increased m times (n and m are natural numbers) with the same number of checks, the amount of information corresponding to the C1 checks of (n–1) code blocks and C2 checks of (M–1) code blocks can be used for recording of other information similar to the above embodiment, making it possible to record other information without increasing the recording density.

Although cases of additionally recording high definition data of video signals are described in the above embodiments, similar effects may be obtained by recording index signals which indicate the contents of video signals as well.

Embodiment 6

Figure 21:
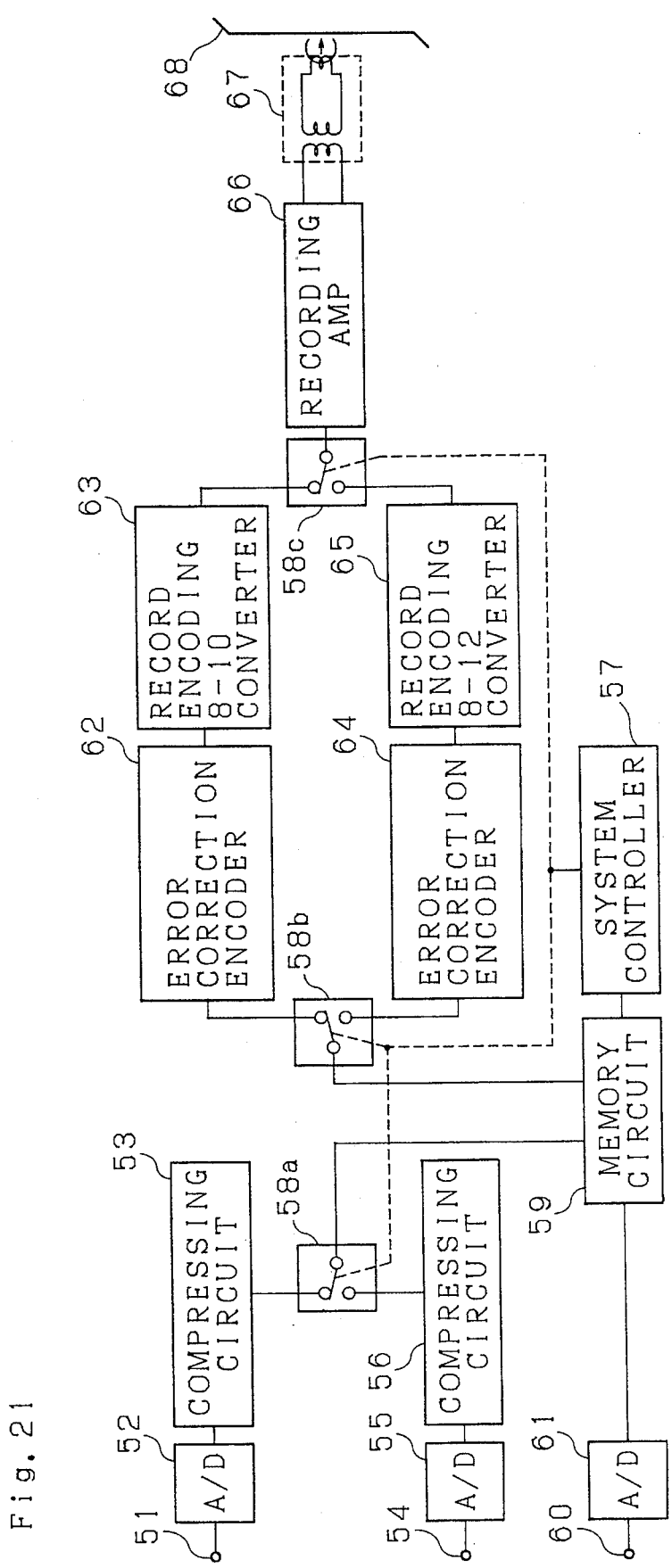
FIG. 21 is a block circuit diagram illustrative of the constitution of the record system of further another digital VTR of the invention.

Embodiment 6 of the invention will now be described below. FIG. 21 shows a block diagram illustrative of the construction of the record system of embodiment 6. Numeral 51 denotes an input terminal for analog NTSC 4:2:2 component signals which are the first video information. Numeral 52 denotes an A/D converter which converts the analog NTSC signals to digital signals. Numeral 53 denotes a compressing circuit which reduces the amount of information of the digitized NTSC video signals. Numeral 54 denotes an input terminal for analog HD signals which are the second video information. Numeral 55 denotes an A/D converter which converts the analog HD signals to digital signals. Numeral 56 denotes a compressing circuit which reduces the amount of information of the digitized HD video signals. Numeral 57 denotes a system controller which performs such tasks as setting the mode and other conditions of the video signal recording/reproduction apparatus and generating index information such as time and program head signal. Numerals 58a, 58b, 58c denote switches which switch the signal path in synchronization with the control signal from the system controller 57. Numeral 59 denotes a memory circuit used in storage of digital signals and time-domain compression and elongation. Numeral 60 denotes an input terminal for analog audio signals. Numeral 61 denotes an A/D converter which converts the analog audio signals to digital signals. Numeral 62 denotes an error correction encoder which appends error-correcting codes when recording digital NTSC video signals. Numeral 63 denotes a record encoding 8-10 converter which converts 8-bit information (1 symbol=8 bits) from the error correction encoder 62 to 10-bit code which suitable for the transmission path. Numeral 64 denotes an error correction encoder which appends error-correcting codes when recording digital HD video signals. Numeral 65 denotes a record encoding 8-12 converter which converts 8-bit information (1 symbol=8 bits) from the error correction encoder 64 to 12-bit code which is suitable for the transmission path. Numeral 66 denotes a recording amplifier. Numeral 67 denotes a rotary drum provided with magnetic heads mounted thereon. Numeral 68 denotes a magnetic tape.

Figure 22:
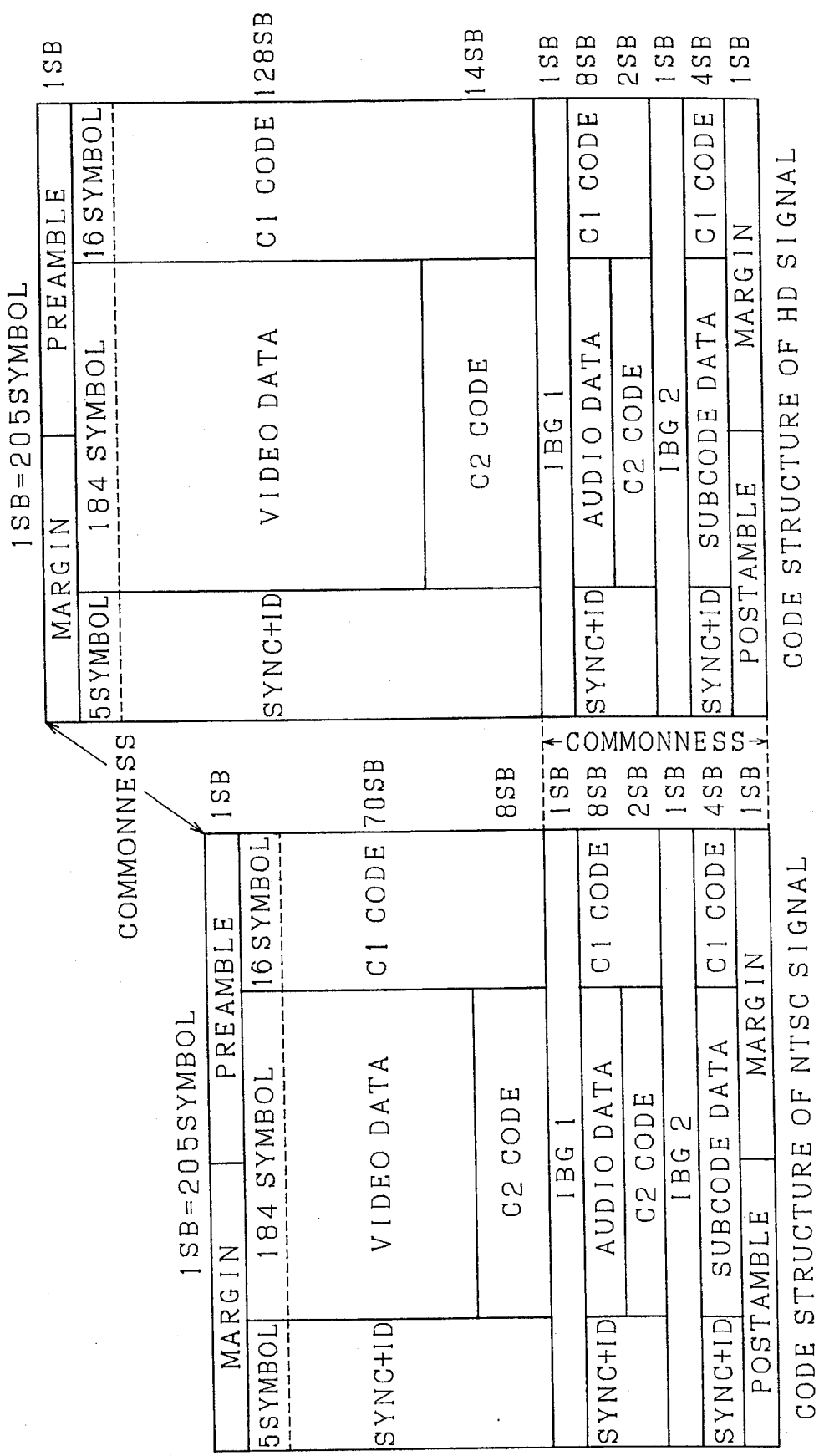
FIG. 22 is a schematic diagram illustrative of the structure of the error-correcting code used in the digital VTR shown in FIG. 21.
Figure 23:
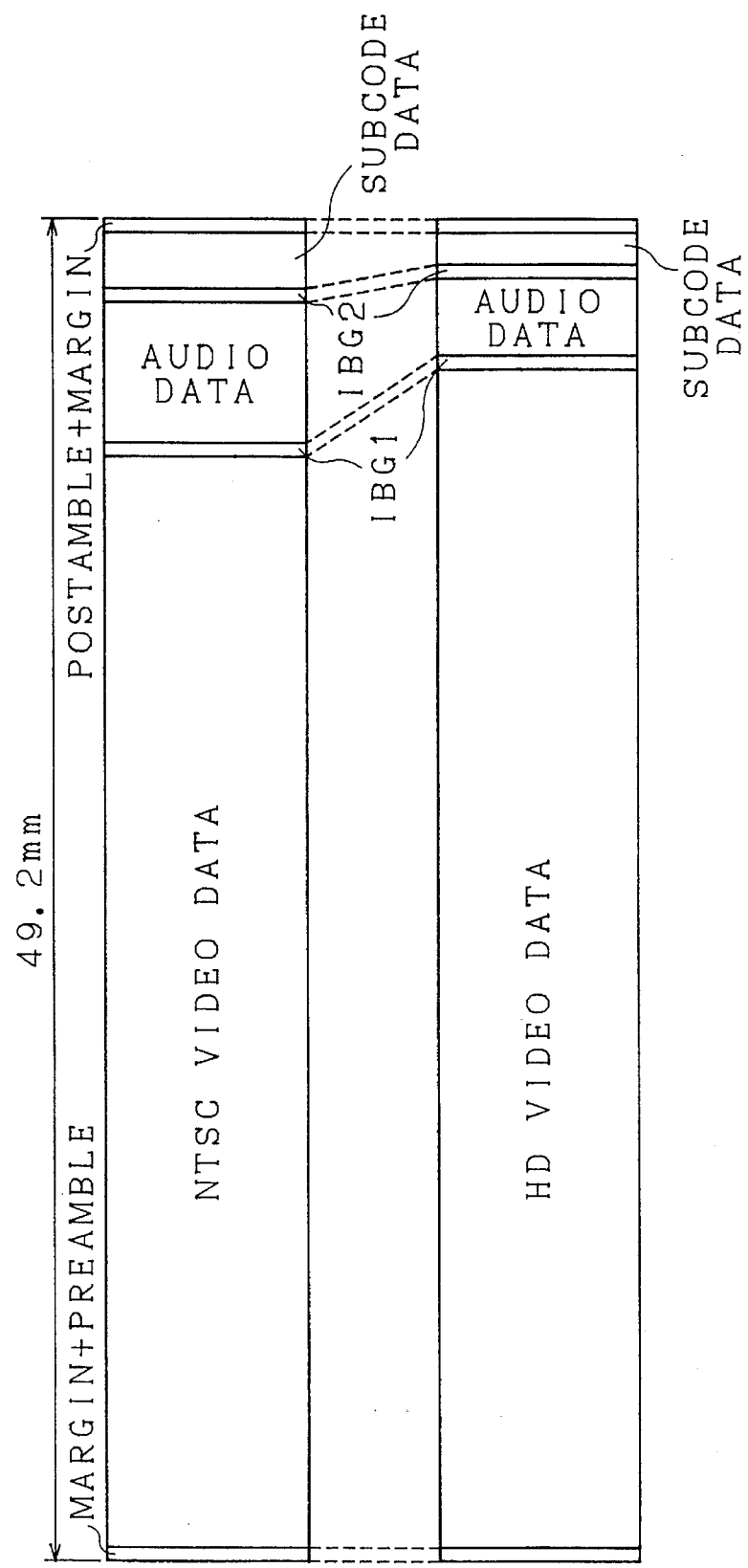
FIG. 23 is a tape format diagram for the digital VTR shown in FIG. 21.

FIG. 22 and FIG. 23 are drawings for complementary explanation of the operation of the video signal recording/reproduction apparatus of this embodiment. FIG. 22 shows a comparison of code constructions generated by the error correction encoder 62 and the error correction encoder 64. FIG. 23 shows a comparison of the track patterns on the magnetic tape 68 in the cases of recording NTSC digital data and HD digital data.

Before describing the operation in detail, features of the digital magnetic recording/reproduction apparatus will be briefly described to help understand the effectiveness of the digital magnetic recording/reproduction apparatus of this embodiment.

In digital recording, variation in the S/N ratio on the transmission path has no influence on the variations of S/N ratio of the video signals and audio signals, if the recorded "1" and "0" signals can be discriminated as the original data. If the data cannot be discriminated, the data can be corrected through arithmetic operations by means of error-correcting codes. Error correction capability depends on the number of correction codes recorded together with the video data and the audio data. In general, greater number of correction codes enables higher capability of correction and higher density of recording.

S/N ratio of the transmission path in digital magnetic recording is obtained as the ratio of the output level at the peak frequency of the signals to be recorded to the noise power within the bandwidth of transmission, and higher S/N ratio is obtained when the maximum recorded signal frequency is lower for a given relative speed of the head and the tape. Further, variation in the S/N ratio on the transmission path of magnetic recording depends greatly on the variation in the spacing loss caused by the variation in the spacing between the head and the tape and on the loss of the demagnetization of the medium, etc., and the maximum recording frequency is preferably lower in order to reduce these influences. It should be noted that spacing loss and the loss of demagnetization are such factors that depend on the recording wavelength, which means shorter wavelengths lead to disadvantage. However, high density recording means a greater amount of information to be recorded in a unit length of medium, which makes it indispensable to record with a shorter wavelength.

Therefore the apparatus must have such specifications and be controlled in such a manner as the maximum output level is obtained at the shortest recording wavelength (maximum recording frequency) and the level is stable.

When recording video information of two or more types with different amounts of information with a digital magnetic recording/reproduction apparatus of the same specifications having such features, it is important to maintain the shortest recording wavelength (maximum recording frequency) constant for all types of recorded information in order to secure the stability and reliability of the apparatus. It is also important to append correction codes having higher correction capability for video information recorded at a high density.

Operation of the apparatus of this embodiment having the object of achieving the features described above will now be described below. The video signal recording/reproduction apparatus of this embodiment is capable of processing two types of video signals; the conventional NTSC 4:2:2 component signals and analog HD signals.

Analog NTSC 4:2:2 component signals received at the input terminal 51 are converted by the A/D converter 52 to digital signals of a transmission rate of about 166 Mbps. Although digital VTR systems for business usually record the above signals on magnetic tapes after appending error-correcting codes to the signals, such a process is not practical for home digital VTR systems because it involves excessive amount of information which leads to excessive use of tape, increased production cost due to higher rate and other reasons. Therefore, this embodiment applies DCT (Discrete Cosine transform), motion compensation and other techniques to the compressing circuit 53, to reduce the video information of 166 Mbps to about 24.7 Mbps, about one seventh of the original. It has been reported in academic meetings and others that compression of NTSC signals to 24 to 25 Mbps does not cause noticeable degradation in the picture quality.

Analog HD signals entered through the input terminal 54 are converted to digital signals of a transmission rate of about 1.2 Gbps by the A/D converter 55. This amount of information far exceeds that of NTSC and cannot be accommodated by a home digital VTR system without compression. Therefore the signals are compressed about 1/26 times to about 45 Mbps of video signals by the compressing circuit 56 employing DCT, motion compensation and other techniques, similarly to NTSC signals.

The reason for the HD signals being compressed at a higher ratio is said to be because HD signals have greater band width of 22 MHz for the luminance signal but lower energy density than the NTSC signals. Because of these factors, it has been reported that good picture quality was obtained even when the signals were compressed to 30 Mbps (Takahashi: "Interlace picture encoding for HDTV", TV Engineering Association, Highvision Research Conference, Lecture No. 6-5, 1992). Digital VTR must not only record and reproduce video signals at a constant rate, but must also perform insert edit and high-speed reproduction, etc. Therefore a compressed signal rate of high definition TV is preferably 45 to 50 Mbps, because it is necessary to give redundancy to the compressed signals unlike the broadcast transmission.

In order to select the video signals to be recorded from among the two kinds of video signals which are compressed as described above, selection command is issued from the system controller 57 and the switch 58a is set to the selected video signal side, to temporarily store the appropriate video signals in the memory circuit 59, to apply time-domain compression.

A digital VTR system should not only record video signals in digital form, but should also record audio signals in digital form to provide high quality audio reproduction comparable to a CD (compact disk), to deserve the name of digital video recording and reproduction. In this embodiment, 4-channel audio signals received at 60 are converted by the A/D converter 61 to digital audio signals with the specifications of sampling frequency of 44.1 KHz and quantization steps of 16 which are comparable to CD, and are supplied as output to the memory circuit 59 at a transmission rate of about 2.8 Mbps. These audio signals are temporarily stored in the memory circuit 59 and compressed in the time domain, similarly to video signals.

A digital VTR system should record the index information such as the time information and TOC (Table of Contents) similarly to DTA (digital audio tape recorder) to provide multiple functions. This embodiment is constituted to generate about 0.35 Mbps of index information with the system controller 57 and temporarily store it as sub-code data similarly to video and audio signals. The audio signals and index information do not require switching regardless of whether the signals are NTSC or HD, with the same amount of information being set for both types of video signals.

Before describing the error correction encoding processing, specifications of the deck of this embodiment will be described. The rotary drum 17 of about 24 mm in diameter and about 6 degrees of still angle is provided with double-azimuth heads opposing each other at 180 degrees interval, with four heads. The revolution speed is 59.94 rps when recording NTSC signals and 60 rps when recording HD signals. The magnetic tape is 1/4 inches in width and has an effective width of 5.15 mm. The tape feed speed is set to a low speed of about 10 to 20 mm/sec. so that the track pitch is 5 to 10 μm.

With the above specifications, track length to record digital signals becomes about 49.2 mm, making it possible to record 240 tracks per second (239.76 tracks to be exact, in the case of NTSC). Therefore, in the mode of recording video signals of two types, number of error-correcting codes and recording density must be set so that this recording capacity is not exceeded.

Recording capacity requirement and the error-correcting codes appending device and the code structure on a track which determines the recording format which take into consideration the requirements which must be satisfied by the magnetic recording and reproduction apparatus, will be described below.

First, a means of recording NTSC video signals will be described. Video signals which have been compressed to about 24.7 Mbps by the compressing circuit 53 are temporarily stored in the memory circuit 59 and are divided into sections each containing the amount of information recorded in one track of the magnetic tape 68, and compressed in the time domain. In this embodiment, because about 240 tracks are generated every second, it will be enough to record video signals (video data) at a rate of about 0.1M bits per track. The error correction encoding process that will be described below is carried out in the unit of 8 bits (represented as 1 Symbol) and at about 12.5 k symbols.

Video signals divided by the memory circuit 59 are fed via the switch 58b to the error correction encoder 62 which generates error-correcting codes where the signals are coded to the code structure of NTSC signals shown in FIG. 22. For the error-correcting code, a double RS code which is employed at present in most of the package media such as CD and DAT. As the code words, there are C1 code wherein the data in the direction of recording track divided by the synchronization signal (SYNC) and C2 code wherein the data is coded in the direction perpendicular to the C1 encoding.

A block divided by the synchronization signal is called the symbol block, represented by a symbol SB, and comprises (2 Symbols of synchronization signals)+(3 Symbols block address indicating the SB position as ID, parity signal determining whether the block address is correct or not during reproduction)+(184 Symbols of video data)+(16 Symbols of C1 code), 205 Symbols in all. 8 Symbols of C2 code are added to 70SB of video data of one track by encoding in the longitudinal direction. Therefore the ratio of encoding is given as (184×70)/(205×78) which has a value of 0.81 and the amount of data related to the video data is 15990 Symbols (127.92 k bits). As for the error correction capability, C1 code has a distance 17 and is capable of correcting up to 8 Symbols within 1SB. When limited to the error position, up to 16 Symbols can be detected, and use of the above detection signal enables it to correct up to 8 Symbols of errors in the longitudinal direction by means of C2 code.

Error correction encoding for audio data will now be described below. About 2.8 Mbps of audio data which is temporarily stored in the memory circuit 59 is divided into sections each containing the amount of information recorded in one track of the magnetic tape 68, and compressed in the time domain. In this embodiment, because about 240 tracks are generated every second, it will be enough to record audio signals at a rate of about 11.76 k bits per track (1470 Symbols). The audio data, similarly to the video data, is sent via the switch 58b to the error correction encoder 62 which generates correction codes for encoding to the specification indicated by the code structure of NTSC signals shown in FIG. 22. A double RS code similar to that for video data is employed as the error-correcting code.

Further, as for the code word, C1 code which is the data encoded in the direction of the recording track which is divided by the synchronization signal is made to be identical with the code for video data, and C2 code which is encoded in the direction perpendicular to C1 code is set to 2 Symbols because it includes a lesser amount of information. With this structure, C1 code has a distance 17 and is capable of correcting up to 8 Symbols within 1SB for audio data. When limited to the error position, up to 16 Symbols can be detected, and the use of the above detection signal enables it to correct up to 2 Symbols of errors in the longitudinal direction by means of C2 code.

Error correction encoding for sub-code data will now be described below. About 0.35 Mbps of sub-code data which is temporarily stored in the memory circuit 59 is divided into sections each containing the amount of information recorded in one track of the magnetic tape 68, and compressed in the time domain. In this embodiment, because about 240 tracks are generated every second, it will be enough to record sub-code signals at a rate of about 1450 bits per track (182 Symbols). The sub-code data, similar to the video data, is sent via the switch 58b to the error correction encoder 62 which generates correction codes for encoding to the specification indicated by the code structure of NTSC signals shown in FIG. 22. A RS code is employed and, as for the code word, only C1 code which is the data encoded in the direction of the recording track which is divided by the synchronization signal is used because it includes a lesser amount of information. C1 code has a distance 17, similar to video data, and is capable of correcting up to 8 Symbols within 1SB. To make up for C2 code not being used, fourfold writing is employed wherein 4SB of the same SB is provided, and only the information of SB which does not include errors or SB with all errors having been corrected with C1 is selected and used. Such an arrangement is indispensable for sub-code format during high-speed searching because there may be such cases that only discontinuous signals can be reproduced due to cross track.

Encoding devices and conditions of error-correcting codes for the three kinds of information which are recorded with the video signal recording/reproduction apparatus of the invention have been described. While initial recording is done by dividing three kinds of information into areas and recording at once by time-division multiplexing, recording format used in digital recording must be capable of after-recording wherein only a part of information is rewritten by write-over of signals which is one of the features. Therefore in the recording format for recording on the magnetic tape 68, information block groups of the three kinds must be constructed by interposing IGB (Inter Group Gap), and IBG1 and IBG2 of 1SB length are interposed between the video data and the audio data, and between audio data and sub-code data, respectively, as shown in FIG. 22. Further, a magnetic recording/reproduction apparatus of rotary head type requires a margin area to compensate for the error of the position where the tape wound around the rotary drum makes contact with the head, preamble area to stabilize the PLL clock synchronized with the reproduced data before reproducing the video data and post-amble area to eliminate erasing failure of leaving data without being erased during partial rewriting of signals by after recording. For this purpose, 1SB before video data and 1SB after sub-code data are provided.

The code structure on the track for recording NTSC video signals can be summarized as shown by the code structure of NTSC signals of FIG. 22, where the amount of data recorded on one track is 205×96=19860 Symbols (157440 bits). Thus recording density on the magnetic tape 68 can be obtained from (No. of bits recorded/Unit track length (1 inch)), as 157440/(4.92/2.54)=81.28 kbps.

Among the above data, 205×18=3690 Symbols except for the video data (205×78 Symbols) are commonly used when recording HD signals, and the same format can be applied to recording of the respective video signals. Therefore, common format is used for all but the encoding of video data to reduce the scale of the circuits, in this embodiment.

Means of recording HD video signals will now be described below. Video signals which have been compressed to about 45 Mbps by the compression circuit 56 are temporarily stored in the memory circuit 59 and are divided into sections each containing the amount of information recorded in one track of similarly to NTSC video data, and compressed in the time domain. In this embodiment, because about 240 tracks are generated every second, it will be enough to record video signals at a rate of about 0.19M bits per track (about 3.5 k Symbols). The divided data is sent via the switch 58 b to the error correction encoder circuit 64 which generates correction codes for encoding to the specification indicated by the code structure of HD signals shown in FIG. 22. A double RS code is employed as the error-correcting code for the purpose of common use with the error correction encoder circuit 62 of the NTSC video system and to make the code structure for other than video data identical with the NTSC. C1 code is made to be the same as NTSC, and increase in the amount of information is accommodated by the increase in the number of SB and, corresponding to this increase, the distance of C2 code is increased.

Specifically, code is made in such structure as indicated by the code structure of HD signals shown in FIG. 22. Video data section includes 128 SB because video data of one track (about 23.5 k Symbols) is grouped into SB of 184 Symbols and recorded. C2 code encodes the 128 SB in the longitudinal direction and adds 14 Symbols. Consequently, ratio of encoding is given by (184×128)/(205×142) which becomes 0.81, and the amount of data related to video data is 29110 Symbols (232.88 k bits). This ratio of encoding is the same as that of NTSC data.

Among the error correction capabilities, C1 code is the same as NTSC as a matter of fact, and is capable of correcting up to 8 Symbols within 1SB. When limited to the error position, up to 16 Symbols can be detected, and use of this detection signal enables it to correct up to 14 Symbols of errors in the longitudinal direction by means of C2 code. In other words, coding of higher correction capability than NTSC data is achieved with the same encoding efficiency by increasing the size of code word. Means and conditions of error correction encoding for HD signals have been described above.

Code structures on the recording tracks are summarized as indicated by the code structure of HD signals shown in FIG. 22. It is a structure where only the video data section is replaced with the video data of NTSC, and the amount of data recorded on a track is 205×160=32800 Symbols (262400 bits), which results in the recording density of 135.5 kbpi on the magnetic tape 18. This recording density is (1/0.6) times that of recording NTSC signals.

Record encoding devices and conditions to make the shortest recording wavelength identical in recording the two kinds of information with different recording densities will now be described below.

Before setting the shortest recording wavelength, performance of the magnetic recording/reproduction system must be known. Recently, as it is made possible to obtain stable performance even at short wavelengths with the shortest recording wavelength of 0.5 μm by the introduction of thin film media made by such processes as metal vapor deposition, shortest wavelength below 0.5 μm has been achieved with a commercial 8 mm VTR of Hi-8, although it is analog recording. For this reason, this embodiment also assumes such recording conditions that the shortest recording wavelength is about 0.5 μm.

Based on the above considerations, when recording NTSC signals, 81.28 Mbpi of information output from the error correction encoder 62 is record-encoded so that the shortest recording wavelength becomes about 0.5 μm. This means to encode information of data bit length 0.3125 μm (shortest recording wavelength 0.625 μm) to obtain about 0.5 μm of shortest recording wavelength. For this purpose, DR of 0.8 will suffice. Therefore, in the apparatus of this embodiment, 8-bit information is converted to 10-bit NRZI codes wherein minimum zero run-length is zero by means of the 8-10 converter 63, then recording signals are obtained after NRZI modulation.

When recording HD signals, on the other hand, 135.5 Mbpi of information output from the error correction encoder circuit 64 is record-encoded so that the shortest recording wavelength becomes about 0.5 μm. This means to encode information of data bit length 0.18745 μm (shortest recording wavelength 0.375 μm) to obtain about 0.5 μm of shortest recording wavelength. For this purpose, DR of 1.3 will suffice. Therefore, in the apparatus of this embodiment, 8-bit information is converted to 12-bit NRZI codes wherein minimum zero run-length is 1 by means of the 8-12 converter 65, then recording signals are obtained after NRZI modulation.

Recording signals obtained as described above are selectively routed to the recording amplifier 66 by the switch 58c to be amplified to a sufficient amplitude to record with the optimum recording current on the magnetic tape 68 by the head mounted on the rotary drum 67. Then the signals are recorded in the recording track pattern as shown in FIG. 23.

By using the apparatus of this embodiment, it is possible to make the recording track length the same for recording of different kinds of information, and also to use the magnetic tape and cassette in common. When it is expected that high-density recording causes a higher code error ratio resulting in a problem of reliability during recording of HD signals which include large amount of information, code error ratio can be improved simply by increasing the width of the recording tracks in contrast to the case of recording NTSC signals of less information. Although picture quality changes a little between standard recording and long-time recording modes of VHS standard VTR with the above operations, it can be said that system compatibility is secured.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A video signal recording/and reproduction apparatus for recording first video signals of a first amount of information and second video signals of a second amount of information different from the first amount of information, in oblique tracks, comprising:

first recording processor for controlling the recording of the first video signals in first type recording tracks including at least an audio sector and a video sector; and second recording processor for controlling the recording of the second video signals in N recording tracks including the first type recording tracks and second type recording tracks, N being a real number multiple of the number of tracks recording the first video signals greater than one, at least a portion of the second video signals being recorded in areas of the second type recording tracks positionally corresponding to the audio sector of the first type recording tracks, the second type recording tracks not including audio sectors.

2. The video signal recording and reproduction apparatus as claimed in claim 1, wherein the second video signals are recorded on twice the number of tracks as that used for recording the first video signals, including the first type recording tracks and the second type recording tracks wherein at least a portion of the second video signals are recorded on the second type recording tracks in areas positionally corresponding to the audio sectors of the first type recording tracks.

3. The video signal recording and reproduction apparatus as claimed in claim 1, wherein the second video signals are recorded on twice the number of tracks as that used for recording the first video signals, with at least two kinds of error-correcting codes being recorded for the second video signals.

4. The video signal recording and reproduction apparatus as claimed in claim 1, wherein the first video signals are standard video signals of 525 scan lines of a field frequency of about 60 Hz or standard video signals of 625 scan lines of a field frequency of about 50 Hz, and the second video signals are high definition video signals.

5. The video signal recording and reproduction apparatus as claimed in claim 4, wherein the high definition video signals are recorded on twice the number of tracks as that used for recording the standard video signals, including the second type recording tracks wherein at least a portion of the high definition video signals are recorded in the second type recording tracks in areas positionally corresponding to the audio sectors of the first type recording tracks.

6. The video signal recording and reproduction apparatus as claimed in claim 4, wherein the high definition video signals are recorded on twice the number of tracks as that used for recording the standard video signals, with at least two kinds of error-correcting codes being recorded for the high definition video signals.

7. The video signal recording and reproduction apparatus of claim 1, wherein at least one of the first and second recording processor further controls the recording of audio signals, corresponding to at least one of the first and second video signals, respectively, in the audio sectors of the first type recording tracks.

8. The video signal recording and reproduction apparatus of claim 7, wherein the second video signals are recorded on twice the number of tracks as the first video signals.

9. The video signal recording and reproduction apparatus of claim 1, further comprising:

reproduction means for reproducing at least one of the recorded first and second video signals.

10. The video signal recording and reproduction apparatus of claim 9, wherein the reproduction means includes, first reproducing means for reproducing recorded first video signals, and second reproducing means for reproducing recorded second video signals.

11. The video signal recording and reproduction apparatus of claim 10, wherein the second reproducing means reproduces second video signals recorded in the first type recording tracks and the second type recording tracks.

12. The video signal recording and reproducing apparatus of claim 1, further comprising:

reproduction means for reproducing at least one of the first and second video signals recorded in at least one of the first type recording tracks and the second type recording tracks.

13. The video signal recording and reproducing apparatus of claim 12, wherein the reproduction means includes, first means for reproducing at least one of first and second video signals recorded in the first type recording tracks; and second means for reproducing at least one of the first and second video signals recorded in the second type recording tracks.

14. The video signal recording and reproduction apparatus of claim 1, wherein the first video signals and the second video signals are recorded on a tape, further comprising:

a digital demodulation processor for digitally demodulating data reproduced from the tape;

a first video signal reproduction processor for restoring the first video signals from the digitally demodulated data;

an audio signal reproduction processor for restoring audio signals from the digitally demodulated data; and a second video signal reproduction processor for restoring the second video signals from the digitally demodulated data.

15. A video signal recording and reproducing method for recording first video signals of a first amount of information and second video signals of a second amount of information different from the first amount of information, comprising the steps of:

(a) recording the first video signals in first type recording tracks, including at least an audio sector and a video sector; and (b) recording the second video signals in at least the first type recording tracks and second type recording tracks, the second type recording tracks not including an audio sector, at least a portion of the second video signals being recorded in areas of the second type recording tracks positionally corresponding to the audio sectors of the first type recording tracks.

16. The video signal recording and reproducing method of claim 15, wherein the second video signals are recorded in N recording tracks, N being a real number multiple of a number of tracks recording the first video signals, the second video signals being recorded in both the first type recording tracks and the second type recording tracks.

17. The video signal recording and reproducing method of claim 16, further comprising the step of:

(c) recording audio signals, corresponding to either the first video signals or the second video signals, in the audio sectors of the first type recording tracks.

18. The video signal recording and reproducing method of claim 17, wherein the second video signals are recorded in twice the number of tracks as the first video signals.

19. The video signal recording and reproducing method of claim 15, wherein the first video signals are standard video signals of 525 or 625 scan lines and the second video signals are high definition video signals.

20. The video signal recording and reproducing method of claim 15, further comprising the steps of:

(c) reproducing at least one of the recorded first and second video signals.

21. The video signal recording and reproducing method of claim 20, wherein recorded second video signals are reproduced from the first type recording tracks and the second type recording tracks in step (c).

22. The video signal recording and reproducing method of claim 15, wherein the first video signals are recorded on a tape in step (a) and the second video signals are recorded on the tape in step (b), further comprising the steps of:

(c) digitally demodulating data reproduced from the tape;

(d) restoring the first video signals from the digitally demodulated data of step (c);

(e) restoring audio signals from the digitally demodulated data of step (c); and (f) restoring the second video signals from the digitally demodulated data of step (c).

23. A digitally recorded tape for reproduction on a tape reproduction apparatus comprising:

first type tracks, including at least an audio sector and a video sector, storing at least one of recorded first video signals of a first amount of information and second video signals of a second amount of information different from the first amount of information in a video sector; and second type tracks, not including an audio sector, storing recorded second video signals, at least a portion of the second video signals being recorded on the second type tracks in an area positionally corresponding to the audio sector of the first type tracks.

24. The digitally recorded tape of claim 23, wherein the second video signals are recorded in both first type tracks and second type tracks.

25. The digitally recorded tape of claim 24, wherein the second video signals are recorded on twice as many tracks and the first video signals.

26. The digitally recorded tape of claim 24, wherein audio signals, corresponding to at least one of the first video signals and second video signals, are stored in the audio sectors of the first type tracks.

27. The digitally recorded tape of claim 23, wherein the first video signals are signals of 525 or 625 scan lines and the second video signals are high definition video signals.

* * * * *